(12) United States Patent
Yoo et al.

(10) Patent No.: US 12,107,191 B2
(45) Date of Patent: Oct. 1, 2024

(54) DISPLAY DEVICE AND MANUFACTURING METHOD THEREFOR

(71) Applicant: Samsung Display Co., LTD., Yongin-si (KR)

(72) Inventors: Je Won Yoo, Bucheon-si (KR); Tae Jin Kong, Hwaseong-si (KR); Hee Keun Lee, Suwon-si (KR); Hyun Min Cho, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 494 days.

(21) Appl. No.: 17/609,882

(22) PCT Filed: Mar. 30, 2020

(86) PCT No.: PCT/KR2020/004316
§ 371 (c)(1),
(2) Date: Nov. 9, 2021

(87) PCT Pub. No.: WO2020/235803
PCT Pub. Date: Nov. 26, 2020

(65) Prior Publication Data
US 2022/0216373 A1    Jul. 7, 2022

(30) Foreign Application Priority Data
May 21, 2019    (KR) .................. 10-2019-0059328

(51) Int. Cl.
*H01L 33/38*    (2010.01)
*H01L 27/15*    (2006.01)
(Continued)

(52) U.S. Cl.
CPC .......... *H01L 33/382* (2013.01); *H01L 27/156* (2013.01); *H01L 33/005* (2013.01); *H01L 33/62* (2013.01); *H01L 2933/0016* (2013.01)

(58) Field of Classification Search
CPC ..... H01L 33/382; H01L 33/63; H01L 33/005; H01L 27/156
See application file for complete search history.

(56) References Cited

U.S. PATENT DOCUMENTS 9,368,549 B1 *   6/2016  Oraw ................... H01L 33/486
11,152,533 B1 * 10/2021  Thompson .......... H01L 25/0753
(Continued)

FOREIGN PATENT DOCUMENTS

JP      201196318 A    5/2011
JP      2015126048 A   7/2015
(Continued)

OTHER PUBLICATIONS

International Search Report mailed Jul. 21, 2020 for PCT/KR2020/004316.

(Continued)

*Primary Examiner* — Mark W Tornow
(74) *Attorney, Agent, or Firm* — CANTOR COLBURN LLP

(57) ABSTRACT

Provided are a display device and a manufacturing method thereof. The display device comprises: a substrate; a first electrode and a second electrode disposed on the substrate to be spaced apart from each other; a first insulating layer disposed on the substrate so as to cover at least a portion of the first electrode and the second electrode; and at least one first light emitting element disposed between the first electrode and the second electrode, on the first insulating layer. The first insulating layer comprises: a first sub-insulating layer comprising a first portion including a hydrophilic material and a second portion which is a region of the first insulating layer except for the first portion and includes a hydrophobic material; and a second sub-insulating layer disposed below the first sub-insulating layer, and at least a (Continued)

portion of the at least one first light emitting element is disposed on the first portion.

20 Claims, 29 Drawing Sheets

(51) Int. Cl.
*H01L 33/00* (2010.01)
*H01L 33/62* (2010.01)

(56) References Cited

U.S. PATENT DOCUMENTS

| | | | |
|---|---|---|---|
| 2006/0105549 | A1 | 5/2006 | Duineveld et al. |
| 2015/0274762 | A1 | 10/2015 | Li et al. |
| 2021/0090925 | A1* | 3/2021 | Yang .................. H01L 25/0753 |
| 2022/0285581 | A1* | 9/2022 | Hong .................. H01L 25/0753 |
| 2024/0063327 | A1* | 2/2024 | Kim ..................... H01L 33/005 |

FOREIGN PATENT DOCUMENTS

| | | |
|---|---|---|
| JP | 6404567 | 10/2018 |
| KR | 20030058151 A | 7/2003 |
| KR | 20030070627 A | 9/2003 |
| KR | 101047034 B1 | 7/2011 |
| KR | 1020140130016 A | 11/2014 |
| KR | 1020150043225 A | 4/2015 |
| KR | 1020180007025 A | 1/2018 |
| KR | 1020180086158 A | 7/2018 |
| KR | 1020180118484 A | 10/2018 |
| KR | 1020190124359 A | 11/2019 |
| KR | 1020200001648 A | 1/2020 |
| KR | 1020200001649 A | 1/2020 |
| KR | 1020200004936 A | 1/2020 |
| KR | 1020200079378 A | 7/2020 |
| WO | 2011132630 | 10/2011 |

OTHER PUBLICATIONS

Extended European Search Report issued in corresponding European Patent Application No. 20810061.0 dated Apr. 26, 2023, citing references listed within.

* cited by examiner

DISPLAY DEVICE AND MANUFACTURING METHOD THEREFOR

CROSS-REFERENCE TO RELATED APPLICATION

This application claims priority to Korean Patent Application No. 10-2019-0059328 filed on May 21, 2019, and all the benefits accruing therefrom under 35 U.S.C. 119, the contents of which in its entirety are herein incorporated by reference.

TECHNICAL FIELD

The disclosure relates to a display device and a manufacturing method thereof.

BACKGROUND ART

The importance of display devices is increasing with the development of multimedia. Accordingly, various types of display devices such as organic light-emitting display ("OLED") devices and liquid crystal display ("LCD") devices are being used.

A display panel such as an OLED panel or an LCD panel is a device included in a display device to display an image. Among such display panels, a light-emitting element may be provided as a light-emitting display panel, and examples of a light-emitting diode ("LED") include an organic LED (OLED) using an organic material as a fluorescent material and an inorganic LED using an inorganic material as a fluorescent material.

An inorganic LED using an inorganic semiconductor as a fluorescent material has durability even in a high-temperature environment and has higher efficiency in blue light compared to the organic LED. In a manufacturing process pointed out as a limit of an existing inorganic LED element, a transfer method using a dielectrophoresis ("DEP") method has been developed. Accordingly, research is being continuously conducted on the inorganic light-emitting diode having higher durability and efficiency than those of the organic light-emitting diode.

DISCLOSURE

Technical Problem

The disclosure is directed to providing a display device in which a structure located between neighboring pixels is omitted and a degree of alignment of light-emitting elements is improved.

The disclosure is also directed to providing a manufacturing method of a display device, in which a light-emitting element is selectively disposed in a certain region.

It should be noted that aspects of the disclosure are not limited thereto and other aspects, which are not mentioned herein, will be apparent to those of ordinary skill in the art from the following description.

Technical Solution

According to an embodiment of the disclosure, a display device comprises a substrate, a first electrode and a second electrode disposed on the substrate to be spaced apart from each other, a first insulating layer disposed on the substrate to cover at least a portion of the first electrode and a portion of the second electrode, and at least one first light-emitting element disposed on the first insulating layer and between the first electrode and the second electrode, and the first insulating layer comprises a first sub-insulating layer including a first portion containing a hydrophilic material and a second portion which is a region of the first insulating layer except for the first portion and which contains a hydrophobic material, and a second sub-insulating layer disposed below the first sub-insulating layer, and at least a portion of the at least one first light-emitting element is disposed on the first portion.

The first portion may be located between the first electrode and the second electrode.

An angle of contact between the first portion and water may be 5 degrees or less, and an angle of contact between the second portion and water may be 100 degrees or more.

The first insulating layer may comprise silicon oxycarbide, the first portion may have a higher concentration of oxygen atoms than the second portion, and the second portion may have a higher concentration of fluorine atoms than the first portion.

The first portion may be disposed to partially overlap a first side of the first electrode and a second side of the second electrode facing the first side of the first electrode.

The second portion may overlap a second side of the first electrode which does not face the second side of the second electrode, and a first side of the second electrode which does not face the first side of the first electrode.

A first region in which the first portion may be located and a second region in which the second portion is located are defined, and the second region may surround the first region.

The at least one first light-emitting element in the first region may have a higher density than the at least one first light-emitting element in the second region.

An emission area, to which light from the at least one first light-emitting element is emitted, may be defined, and the emission area may comprise the first region.

The display device may further comprise a third electrode and a fourth electrode disposed on the substrate and spaced apart from each other, and the first insulating layer may be also disposed on the third electrode and the fourth electrode, the first portion may be also located between the third electrode and the fourth electrode, and the second portion may be located between the third electrode and the first electrode.

The display device may further comprise at least one second light-emitting element disposed on the first portion and between the third electrode and the fourth electrode, and the at least one second light-emitting element may emit light having a different wavelength band from a wavelength band of the first-light emitting element.

According to an embodiment of the disclosure, a display device comprise: a substrate, a first electrode disposed on the substrate and extending in a first direction, a second electrode extending in the first direction and spaced apart from the first electrode in a second direction different from the first direction, a first insulating layer disposed to cover at least a portion of the first electrode and at least a portion of the second electrode, and at least one light-emitting element disposed on the first insulating layer and between the first electrode and the second electrode, and the first insulating layer comprises: a first portion including a hydrophilic material and located in a region between the first electrode and the second electrode, and a second portion which includes a hydrophobic material and is a region of the first insulating layer except for the first portion.

The display device may further comprise a third electrode spaced apart from the first electrode in the second direction, and the first insulating layer may extend to be disposed on the third electrode, the second portion is located between the first electrode and the third electrode, and the light-emitting elements between the first electrode and the second electrode may have a higher density than a density of the light-emitting elements between the first electrode and the third electrode.

An angle of contact between the first portion and water may be 5 degrees or less, and an angle of contact between the second portion and water may be 100 degrees or more.

The first insulating layer may further comprise a sub-insulating layer located below the first portion and the second portion.

The first portion may be provided in plural, at least two first portions of the plurality of first portions may be spaced apart from each other in the second direction, and the second portion may be located in a region between the at least two first portions.

According to an embodiment of the disclosure, a manufacturing method of a display device, comprises forming a substrate, a first electrode and a second electrode disposed on the substrate to be spaced apart from each other, and a first insulating layer covering at least a portion of the first electrode and the second electrode, forming, on the first insulating layer, a first portion including a hydrophilic material and a second portion including a hydrophobic material, and disposing a light-emitting element on the first portion and between the first electrode and the second electrode.

The forming of the first portion and the second portion may comprise forming the second portion by emitting a first plasma to the first insulating layer, and forming the first portion by emitting a second plasma to the first portion between the first electrode and the second electrode.

The first insulating layer may comprise silicon oxycarbide, the first plasma may comprise a fluorine (F)-based plasma, and the second plasma may comprise an oxygen (O)-based plasma.

The first insulating layer may further comprise a sub-insulating layer located below the first portion and the second portion.

The details of other embodiments are included in the detailed description and the accompanying drawings.

Advantageous Effects

A display device according to an embodiment may include a first insulating layer including a hydrophilic area and a hydrophobic area, and a light-emitting element may be selectively disposed in the hydrophilic area. In the display device, the number of light-emitting elements remaining in a region, except for a region in which light-emitting elements are disposed, may be minimized, and light-emitting elements may be aligned at a certain position even when a structure between adjacent pixels is omitted. Accordingly, in the display device, light-emitting elements may be aligned in a pixel to be distinguished from other pixels even when a size of each pixel is reduced.

The effects according to the embodiments are not limited by the contents exemplified above, and more various effects are included in this disclosure.

MODES OF THE INVENTION

The invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will filly convey the scope of the invention to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the invention. Similarly, the second element could also be termed the first element.

Hereinafter, embodiments will be described with reference to the accompanying drawings.

Figure 1:
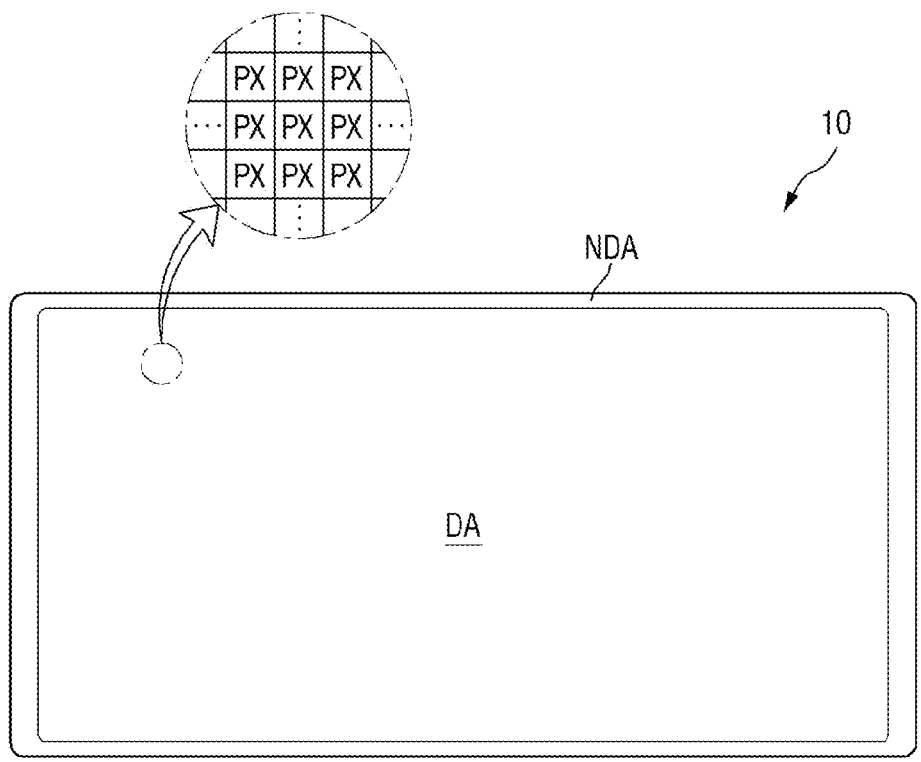
FIG. 1 is a schematic plan view of a display device according to an embodiment.

FIG. 1 is a schematic plan view of a display device according to an embodiment.

Referring to FIG. 1, a display device 10 displays a video or a still image. The display device 10 may refer to all types of electronic devices that provide a display screen. Examples of the display device 10 may include a television, a notebook computer, a monitor, a billboard, an internet-of-things ("IoT") device, a mobile phone, a smartphone, tablet personal computer ("PC"), an electronic watch, a smart watch, a watch phone, ahead-mounted display, a mobile communication terminal, an electronic notebook, an e-book reader, a portable multimedia player ("PMP"), a navigation device, a game console, a digital camera, a camcorder, or the like, which provide a display screen.

The display device 10 includes a display panel for providing a display screen. Examples of the display panel include a light-emitting diode (LED) display panel, an organic light-emitting display panel, a quantum dot light-emitting display panel, a plasma display panel, a field-emission display panel, or the like. A case in which an LED display panel is applied as an example of a display panel will be described below, but embodiments are not limited thereto and another type of a display panels may be applied provided that the same technical idea is applicable thereto.

The display device 10 may be embodied in various shapes. For example, the display device 10 may have a shape such as a rectangular shape that is long in a horizontal direction, a rectangular shape that is long in a vertical direction, a square shape, a quadrangle with round corners (vertices), another polygonal shape, or a round shape. A shape of a display area DA of the display device 10 may be substantially similar to that of the display device 10. FIG. 1 illustrates the display device 10 and the display area DA each having a rectangular shape that is long in the horizontal direction.

The display device 10 may include the display area DA and a non-display area NDA. The display area DA is an area in which a screen is displayed, and the non-display area NDA is an area in which no screen is displayed. The display area DA may be referred to as an active area, and the non-display area NDA may be referred to as an inactive area.

In general, the display area DA may be a central area of the display device 10. The display area DA may include a plurality of pixels PX. The plurality of pixels PX may be arranged in a matrix. Each of the plurality of pixels PX may have a rectangular or square shape on a plane but is not limited thereto and may be a rhombus shape, each side of which is inclined with respect to a first direction DR1. Each of the plurality of pixels PX may include at least one light-emitting element 300 that emits light of a certain wavelength band to display a certain color.

Figure 2:
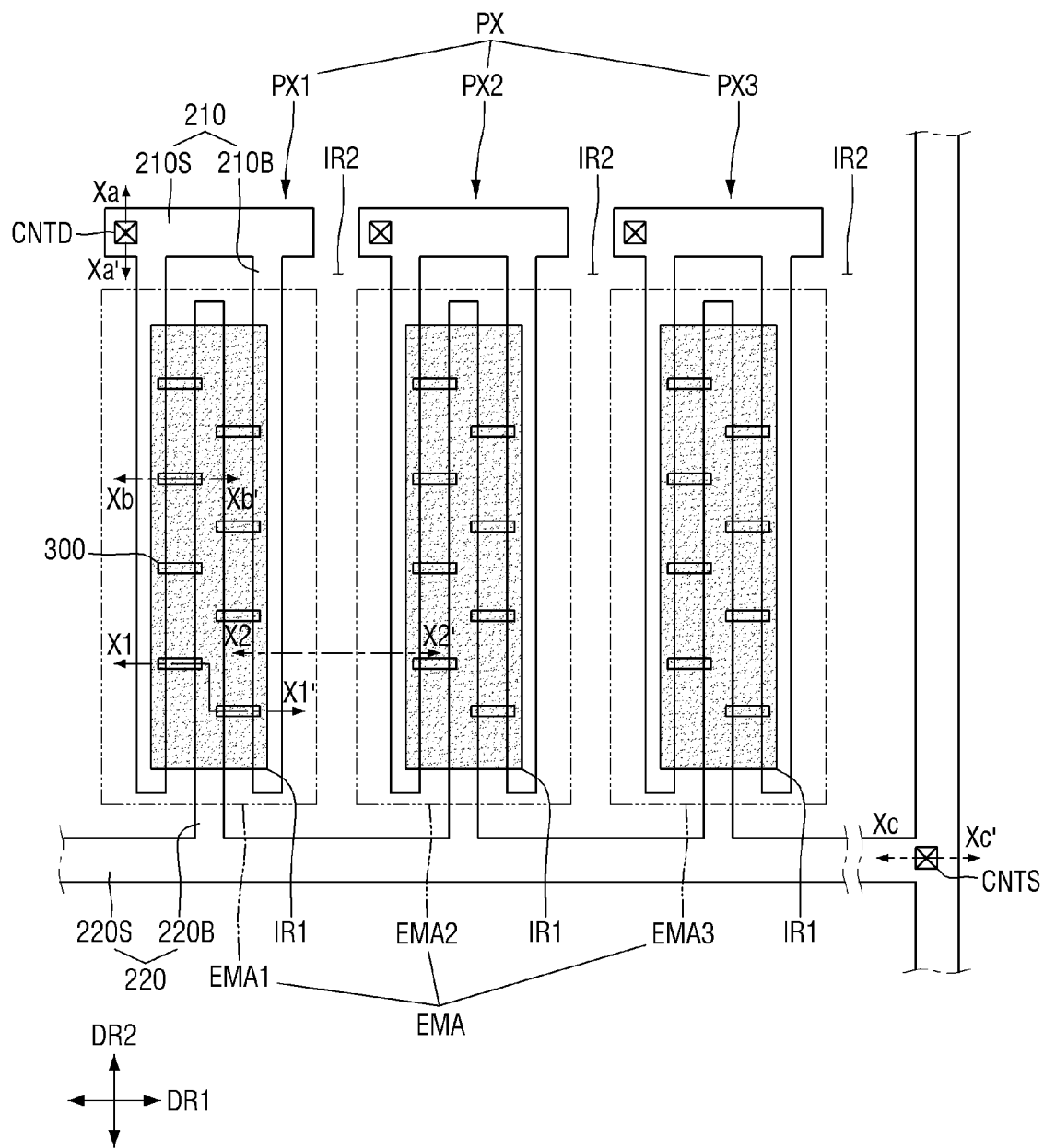
FIG. 2 is a schematic plan view of a pixel of a display device according to an embodiment.

FIG. 2 is a schematic plan view of a pixel of a display device according to an embodiment.

Referring to FIG. 2, each of a plurality of pixels PX may include a first sub-pixel PX1, a second sub-pixel PX2, and a third sub-pixel PX3. The first sub-pixel PX1 may emit light of a first color, and the second sub-pixel PX2 may emit light of a second color, and the third sub-pixel PX3 may emit light of a third color. The first color may be red, the second color may be green, the third color may be blue, but embodiments according to the invention are not limited thereto, and sub-pixels PXn may emit light of the same color in another embodiment. FIG. 2 illustrates that each pixel PX includes three sub-pixels PXn, but is not limited thereto and may include more than three sub-pixels PXn in another embodiment.

As used herein, the terms "first," "second," etc. are used to simply distinguish components from each other rather than to limit the components. That is, configurations defined by the term "first," 'second" or the like are not necessarily limited to specific configurations or positions and other numbers may be assigned thereto in some cases. Thus, the number assigned to each component herein may be described with reference to the drawings and the following description, and a first component referred to hereinafter may be named a second component within the technical idea of the disclosure.

Each of sub-pixels PXn of the display device 10 may include an area defined as an emission area EMA. The first sub-pixel PX1 may include a first emission area EMA1, the second sub-pixel PX2 may include a second emission area EMA2, and the third sub-pixel PX3 may include a third emission area EMA3. The emission area EMA may be defined as an area in which a light-emitting element 300 included in the display device 10 is disposed to emit light of a certain wavelength band. The light-emitting element 300 may include an active layer 330 illustrated in FIG. 9 as will be described below, and the active layer 330 may emit light of a certain wavelength band without directionality. That is, light emitted from the active layer 330 of the light-emitting element 300 may be emitted in directions toward sides of the light-emitting element 300, as well as in directions toward opposite distal ends of the light-emitting element 300. The emission area EMA of each sub-pixel PXn may include an area in which the light-emitting element 300 is disposed and an area which is located adjacent to the light-emitting element 300 and to which light is emitted from the light emitting element 300. However, embodiments according to the invention are not limited thereto, and the emission area EMA may further include an area to which light emitted from the light-emitting element 300 is reflected or refracted by another member in another embodiment. A plurality of light-emitting elements 300 may be disposed in each sub-pixel PXn, and an emission area EMA may include an area in which the plurality of light-emitting elements 300 are disposed and areas adjacent to this area.

Although not shown in the drawings, each sub-pixel PXn of the display device 10 may include a non-emission area defined as a region except for the emission area EMA. The non-emission area may be defined as an area in which the light-emitting element 300 is not disposed and to which light is not emitted because light emitted from the light-emitting element 300 does not reach.

Figure 8:
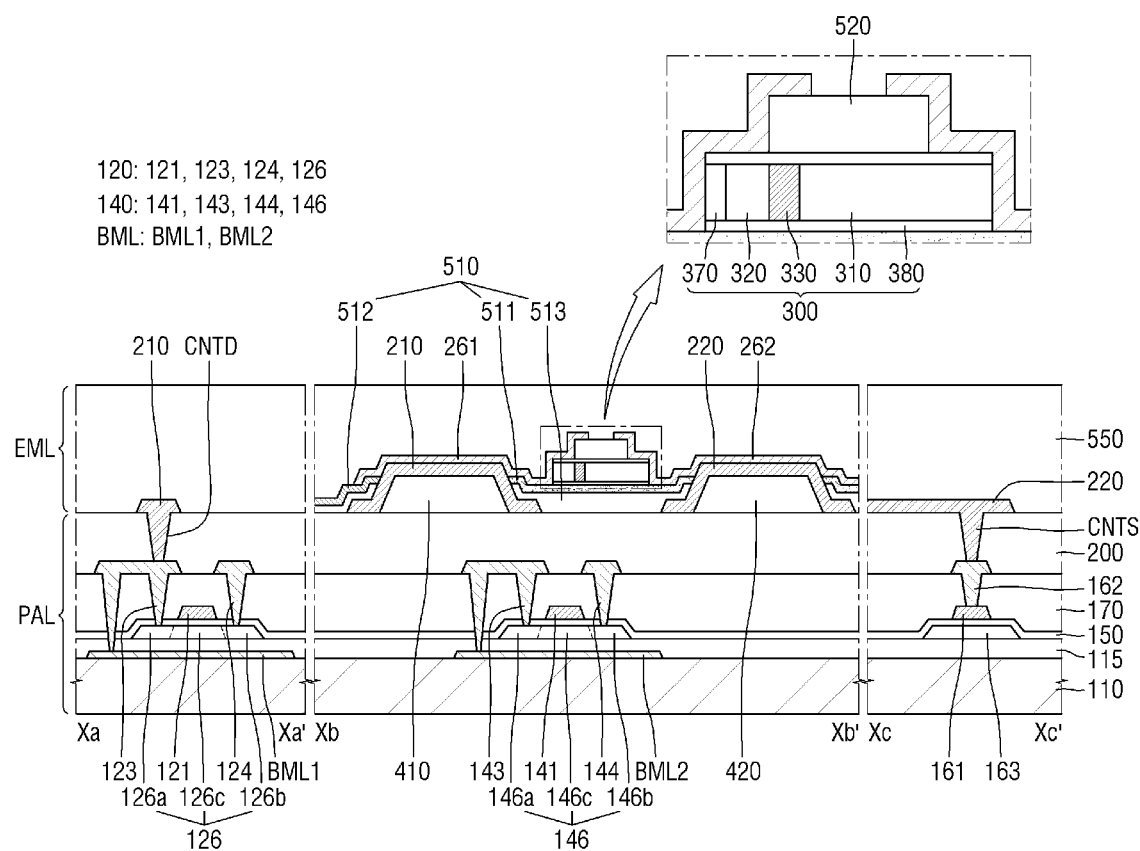
FIG. 8 is a cross-sectional view taken along lines Xa-Xa', Xb-Xb' and Xc-Xc' of FIG. 2.

Each sub-pixel PXn of the display device 10 may include a plurality of electrodes 210 and 220, the light-emitting element 300, and at least one insulating layer, e.g., insulating layers 510, 520, and 550 illustrated in FIG. 8.

The plurality of electrodes 210 and 220 may be electrically connected to the light-emitting elements 300, and a certain voltage may be applied thereto so that the light-emitting elements 300 may emit light of a certain wavelength band. At least a portion of each of the plurality of electrode 210 and 220 may be used to form an electric field in each sub-pixel PXn so as to align the light-emitting elements 300.

The plurality of electrodes 210 and 220 may include a first electrode 210 and a second electrode 220. In an embodiment, the first electrodes 210 may be pixel electrodes separated for sub-pixels PXn, and the second electrode 220 may be a common electrode commonly connected along the sub-pixels PXn. One of the first and second electrodes 210 and 220 may be an anode electrode of the light-emitting element 300, and the other may be a cathode electrode of the light-emitting element 300. However, embodiments according to the invention are not limited thereto, and vice versa in another embodiment.

The first electrode 210 and the second electrode 220 may include electrode stem portions 210S and 220S extending in a first direction DR1 and at least one electrode branch portion, e.g., electrode branch portions 210B and 220B branching from the electrode stem portions 210S and 220S, respectively, and extending in a second direction DR2 crossing the first direction DR1.

The first electrode 210 may include the first electrode stem portion 210S extending in the first direction DR1 and at least one first electrode branch portion 210B branching from the first electrode stem portion 210S and extending in the second direction DR2.

A first electrode stem portion 210S of a pixel may have opposite ends between sub-pixels PXn to be spaced apart from each other, and may be located in substantially the same straight line as a first electrode stem portion 210S of a sub-pixel PXn adjacent in the same row (a sub-pixel PXn adjacent, for example, in the first direction DR1). Opposite ends of the first electrode stem portion 210S in each of the sub-pixels PXn may be spaced apart from opposite ends of the first electrode stem portions 210S in the other sub-pixels PXn to supply different electrical signals to the first electrode branch portions 210B, and the first electrode branch portions 210B may be driven separately.

The first electrode branch portion 210B may branch from at least a portion of the first electrode stem portion 210S and extend in the second direction DR2, and the branching thereof may end such that the first electrode branch portion 210B is spaced apart from the second electrode stem portion 220S facing the first electrode stem portion 210S.

The second electrode 220 may include the second electrode stem portion 220S extending in the first direction DR1 to face the first electrode stem portion 210S while being spaced apart from the first electrode stem portion 210S in the second direction DR2, and the second electrode branch portion 220B branching from the second electrode stem portion 220S and extending in the second direction DR2. An end of the second electrode stem portion 220S may be connected to a second electrode stem portion 220S of another sub-pixel PXn adjacent in the first direction DR1. That is, the second electrode stem portion 220S may extend in the first direction DR1 to cross each sub-pixel PXn, unlike the first electrode stem portion 210S. The second electrode stem 220S crossing each sub-pixel PXn may be connected to an outer side of the display area DA in which each pixel PX or each sub-pixel PXn is disposed or an extending portion of the non-display area NDA in a certain direction.

The second electrode branch portion 220B may be spaced apart from the first electrode branch portion 210B to face the first electrode branch portion 210B, and the second electrode branch portion 220B may end while being spaced apart from the first electrode stem portion 210S. The second electrode branch portion 220B may be connected to the second electrode stem portion 220S, and an end of the second electrode branch portion 220B in a direction in which the second electrode branch portion 220B extends may be located in the sub-pixel PXn while being spaced apart from the first electrode stem portion 210S.

Although in the drawings, a case that two first electrode branch portions 210B are located in each sub-pixel PXn and one second electrode branch portion 220B is located between the two first electrode branch portions 210B is illustrated, embodiments according to the invention are not limited thereto. Alternatively, the first electrode 210 and the second electrode 220 may not necessarily have shapes extending in one direction and may be disposed in various structures. For example, the first electrode 210 and the second electrode 220 may each have a partially curved or bent shape or one of the first and second electrodes 210 and 220 may be arranged to surround the other. A structure or shape in which the first electrode 210 and the second electrode 220 are disposed are not particularly limited, provided at least some regions thereof are spaced apart from each other to face each other so as to form a space therebetween, in which the light-emitting element 300 may be arranged.

Figure 7:
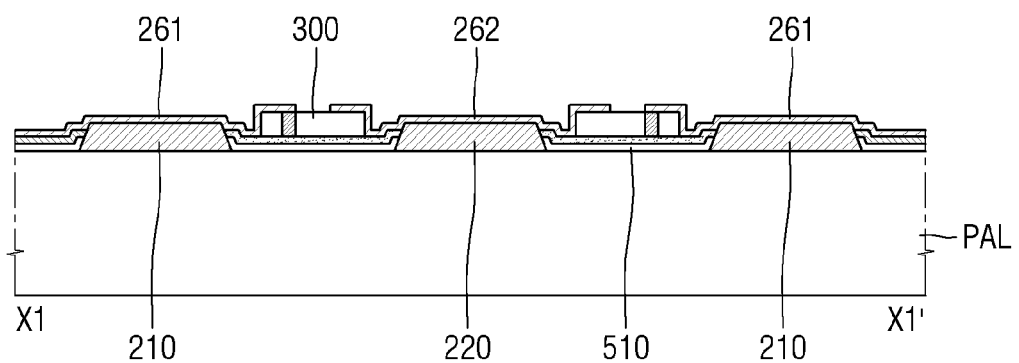
FIG. 7 is a cross-sectional view schematically illustrating a partial cross section of a display device according to an embodiment.

The first electrode 210 and the second electrode 220 may be electrically connected to a circuit element layer PAL of FIG. 7 of the display device 10 through contact holes, e.g., through a first electrode contact hole CNTD and a second electrode contact hole CNTS, respectively. In the drawings, a first electrode contact hole CNTD is formed for the first electrode stem portion 210S of each sub-pixel PXn, and a second electrode contact hole CNTS is formed for only one second electrode stem portion 220S crossing each sub-pixel PXn. However, embodiments according to the invention are not limited thereto, and second electrode contact holes CNTS may be formed for the sub-pixels PXn in some cases.

The plurality of light-emitting elements 300 may be disposed between the first electrode 210 and the second electrode 220. As shown in the drawings, the plurality of light-emitting elements 300 may be disposed between the first electrode branch portion 210B and the second electrode branch portion 220B. One end of each of at least some of the plurality of light-emitting elements 300 may be electrically connected to the first electrode 210 and another end thereof may be electrically connected to the second electrode 220. The opposite ends of the light-emitting element 300 may be disposed on the first electrode branch portion 210B and the second electrode branch portion 220B, respectively, but embodiments according to the invention are not limited thereto. In some cases, the light-emitting element 300 may be disposed between the first electrode 210 and the second electrode 220 such that the opposite ends thereof do not overlap the first electrode 210 and the second electrode 220.

The plurality of light-emitting elements 300 may be disposed between the first and second electrode 210 and 220 to be spaced apart from each other and aligned to be substantially parallel to each other. A gap between the plurality of light-emitting elements 300 is not particularly limited. In some cases, the plurality of light-emitting elements 300 may be arranged adjacent to each other to be clustered together, and a plurality of other light-emitting elements 300 may be clustered together to be spaced a certain distance from each other or may be arranged in different densities while being oriented and aligned in a direction. In an embodiment, the light-emitting element 300 may have a shape extending in one direction, and a direction in which each electrode, e.g., the first electrode branch portion 210B and the second electrode branch portion 220B, extends and a direction in which the light-emitting element 300 extends may be substantially perpendicular to each other. However, embodiments according to the invention are not limited thereto, and the light-emitting element 300 may not be perpendicular to the direction in which the first electrode branch portion 210B and the second electrode branch portion 220B extend but may be tilted thereto in another embodiment.

The display device 10 according to an embodiment may include a first insulating layer 510 covering at least a part of the first electrode 210 and the second electrode 220, and each sub-pixel PXn may include a first region IR1 and a second region IR2 of the first insulating layer 510, which include materials having different polarities.

The first insulating layer 510 may be disposed on each sub-pixel PXn of the display device 10. The first insulating layer 510 may be disposed to substantially entirely cover each sub-pixel PXn and extend to neighboring sub-pixels PXn. The first insulating layer 510 may be disposed to cover at least a part of the first electrode 210 and the second electrode 220. Although not shown in FIG. 2, the first insulating layer 510 may be disposed to expose part of the first electrode 210 and the second electrode 220, and particularly, some regions of the first electrode branch portion 210B and the second electrode branch portion 220B. This will be described in detail with reference to other drawings below.

In the first insulating layer 510, a region including a hydrophilic material and a region including a hydrophobic material may be formed. The region including the hydrophilic material may be the first region IR1, and the region including the hydrophobic material may be the second region IR2. As illustrated in FIG. 2, the first region IR1 and the second region IR2 may be formed in each sub-pixel PXn of the display device 10.

Each of first regions IR1 may be disposed for one of the sub-pixels PXn. The first regions IR1 may overlap the first electrode 210 and the second electrode 220 disposed for each sub-pixel PXn. Specifically, the first region IR1 may be positioned to include the first electrode branch portion 210B, the second electrode branch portion 220B, and a region therebetween. A plurality of first regions IR1 may be formed for the sub-pixels PXn and thus the first regions IR1 disposed in neighboring sub-pixels PXn may be spaced apart from each other in a direction, e.g., the first direction DR1 or the second direction DR2. That is, the first regions IR1 may be formed in an island or linear pattern on substantially an entire area of the display device 10.

The second region IR2 is a region except for the first regions IR1 and may be formed to surround the first regions IR1. The second region IR2 may be formed to surround the first regions IR1 and integrally connected to each sub-pixel PXn. In an embodiment, the second regions IR2 may be located at boundaries of neighboring sub-pixels PXn. The second region IR2 may be formed at boundaries between sub-pixels adjacent in the first direction DR1, e.g., the first sub-pixel PX1, the second sub-pixel PX2, and the third sub-pixel PX3, to extend in the second direction DR2. Although not shown in the drawings, the second region IR2 may be formed at boundaries between the first sub-pixel PX1, the second sub-pixel PX2, and the third sub-pixels PX3 and sub-pixels PXn adjacent thereto in the second direction DR2 to extend in the first direction DR1. That is, the second regions IR2 may be formed in a lattice pattern on a substantially entire area of the display device 10.

According to an embodiment, the display device 10 may include first regions IR1, each of which is disposed for one of the sub-pixels PXn, and a second region IR2, which is a region except for the first regions IR1, and the light-emitting elements 300 disposed for the sub-pixels PXn may be disposed in the first regions IR1. The first region IR1 may be located between the first electrode 210 and the second electrode 220, for example, between the first electrode branch portion 210B and the second electrode branch portion 220B. The light-emitting element 300 may be aligned in the first region IR1 and between the first electrode branch portion 210B and the second electrode branch portion 220B. Accordingly, the first region IR1 may be included in the emission area EMA in which the light-emitting elements 300 are arranged and to which light from the light-emitting elements 300 is emitted. That is, the emission area EMA of each sub-pixel PXn may have a larger area than the first region IR1. However, embodiments according to the invention are not limited thereto, and the emission area EMA and the first region IR1 may have substantially the same area.

Figure 5:
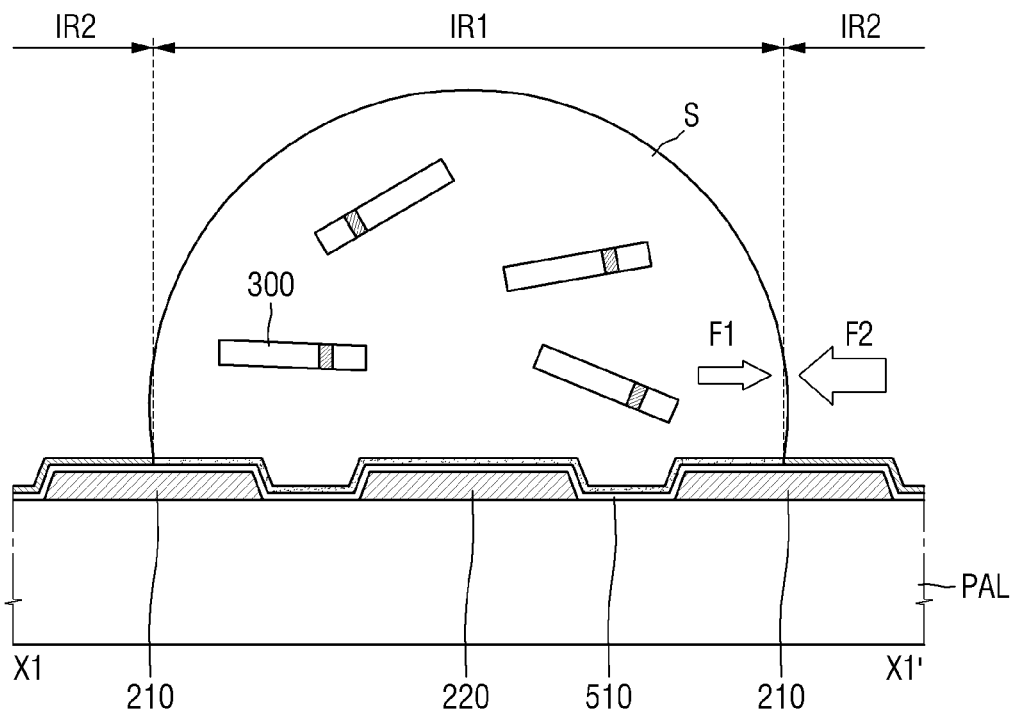
FIG. 5 is a schematic diagram illustrating that ink is sprayed on a first insulating layer according to an embodiment.

In an embodiment, the light-emitting elements 300 may be disposed between the first and second electrodes 210 and 220 by spraying ink S of FIG. 5, in which the light-emitting elements 300 are dispersed, onto the first and second electrodes 210 and 220 and supplying an alignment signal to the first and second electrodes 210 and 220 during a manufacturing process of the display device 10. Here, the ink S in which the light-emitting elements 300 are dispersed may be sprayed onto the first insulating layer 510 on the first and second electrodes 210 and 220 and may have liquidity on the first insulating layer 510 and thus move to an adjacent region. The display device 10 according to an embodiment may include a first region IR1 and a second region IR2 of the first insulating layer 510, which include materials having different polarities, and thus, the ink S in which the light-emitting elements 300 are dispersed may be induced to be located in the first region IR1.

The ink S may form a relatively stronger attractive force with the material included in the first region IR1 of the first insulating layer 510 than the material included in the second region IR2 of the first insulating layer 510 and may be sprayed onto the first insulating layer 510 to be provided to the first region IR1. As the first region IR1 is formed between the first electrode 210 and the second electrode 220 in which the light-emitting elements 300 are aligned, the ink S in which the light-emitting elements 300 are dispersed are provided on the first region IR1 and thus a great part of the light-emitting elements 300 may be aligned between the first electrode 210 and the second electrode 220. Each pixel PX or sub-pixel PXn of the display device 10 includes the first region IR1 and the second region IR2, and thus, during the manufacturing process of the display device 10, the ink S in which the light-emitting elements 300 are dispersed may be induced to be moved to a certain region, and the number of light-emitting elements 300 in a region except for the region between the first electrode 210 and the second electrode 220 may be minimized. That is, during the manufacturing process of the display device 10 according to an embodiment, the number of lost light-emitting elements 300 or the number of defective light-emitting elements 300 that are not connected to the electrodes 210 and 220 in each sub-pixel PXn may be minimized.

In the manufacturing process of the display device 10, the ink S in which the light-emitting elements 300 are dispersed may be prevented from flowing to other sub-pixels PXn even when no structure is disposed between adjacent sub-pixels PXn or a structure between adjacent sub-pixels PXn is omitted. The ink S sprayed onto each sub-pixel PXn may be induced to be moved to the first region IR1 and prevented from flowing to the second region IR2 from a boundary between the first region IR1 and the second region IR2. The second region IR2 may be formed at boundaries between sub-pixels PXn, and the ink S sprayed onto one sub-pixel PXn may be prevented from moving beyond a boundary between the sub-pixel PXn and a neighboring sub-pixel PXn.

According to an embodiment, the first insulating layer 510 of the display device 10 may include first sub-insulating layers 511 and 512 and a second sub-insulating layer 513, and the first sub-insulating layers 511 and 512 may include a first portion 511 and a second portion 512, respectively. A region in which the first portion 511 is located and a region in which the second portion 512 is located may form the first region IR1 and the second region IR2 described above, respectively. The first region IR1 in which the light-emitting elements 300 are disposed may be a region in which the first portion 511 of the first insulating layer 510, which includes a hydrophilic material, is positioned, and the second region IR2 may be a region in which the second portion 512 of the first insulating layer 510, which includes a hydrophobic material is positioned. This will be described in detail with reference to other drawings below.

Figure 3:
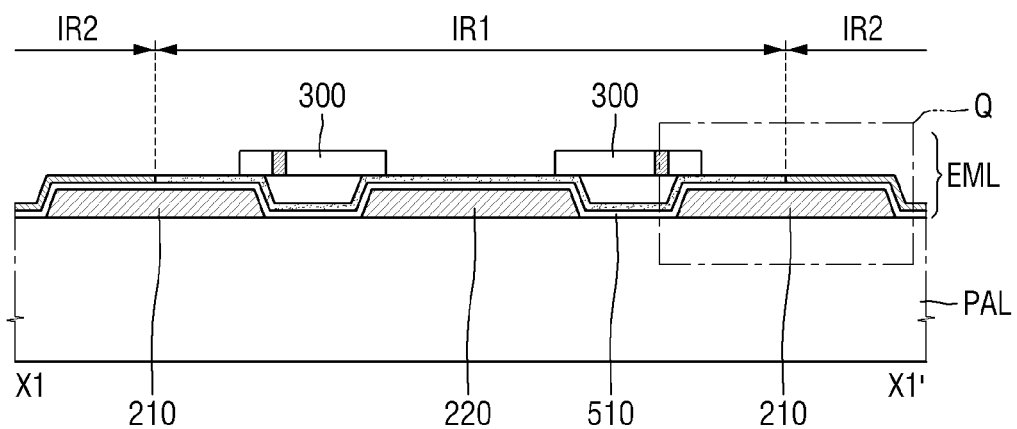
FIG. 3 is a schematic cross-sectional view taken along line X1-X1' of FIG. 2.
Figure 4:
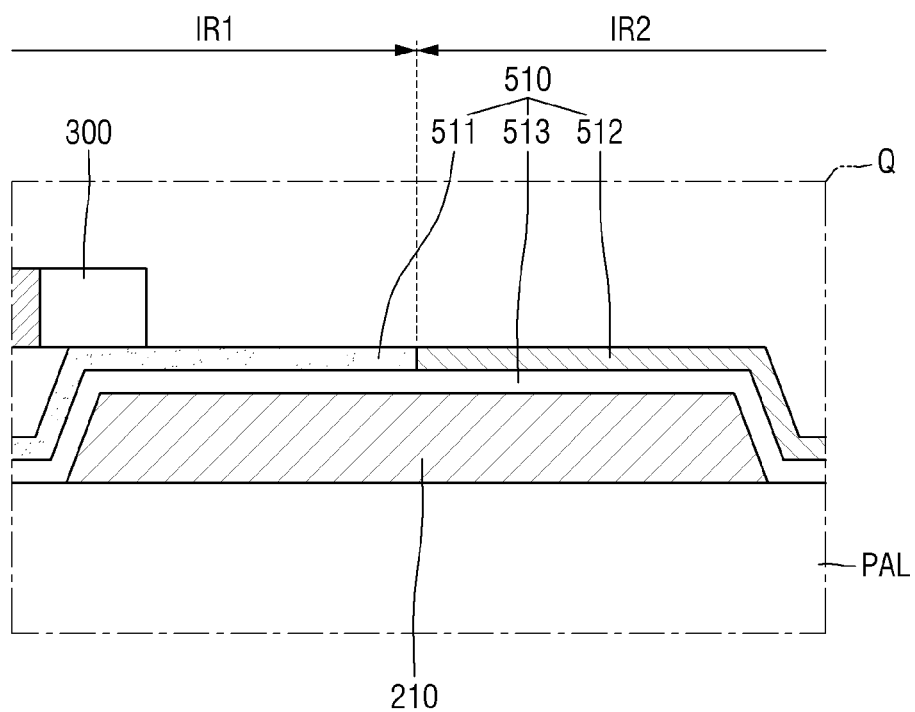
FIG. 4 is an enlarged view of a portion Q of FIG. 3.
Figure 6:
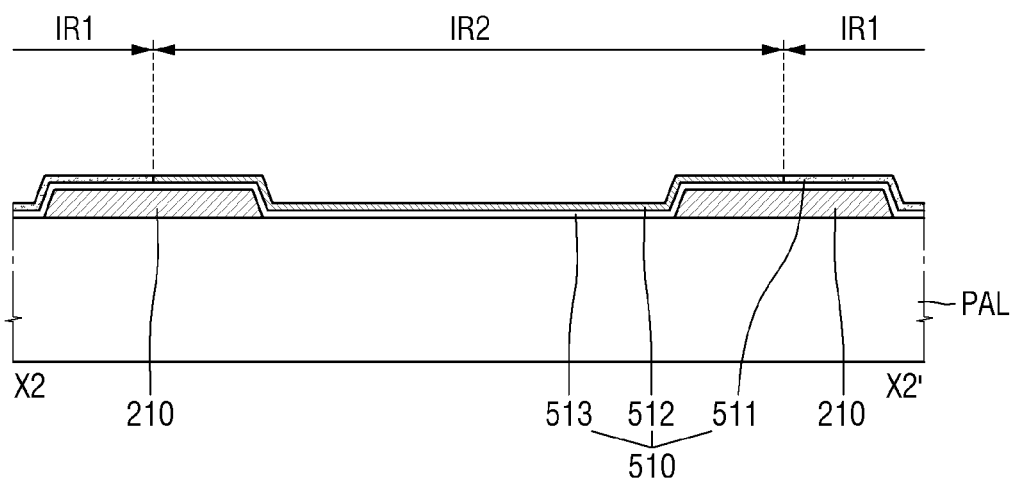
FIG. 6 is a schematic cross-sectional view taken along line X2-X2' of FIG. 2.

FIG. 3 is a schematic cross-sectional view taken along line X1-X1' of FIG. 2. FIG. 4 is an enlarged view of a portion Q of FIG. 3. FIG. 5 is a schematic diagram illustrating that ink is sprayed on a first insulating layer according to an embodiment. FIG. 6 is a schematic cross-sectional view taken along line X2-X2' of FIG. 2.

FIGS. 3 to 6 schematically illustrate a cross section of one sub-pixel PXn and thus a structure of the display device 10 according to an embodiment according to the invention is not limited thereto. FIGS. 3 to 6 illustrate only a first electrode 210, a second electrode 220, a first insulating layer 510, and light-emitting elements 300, which are disposed in each sub-pixel PXn, but the display device 10 may further include a plurality of other members.

Referring to FIGS. 3 to 6, the display device 10 according to an embodiment may include a circuit element layer PAL and an emission layer EML located on the circuit element layer PAL. Structures of these components will be described in detail below. The light-emitting elements 300 are disposed on the emission layer EML. The emission layer EML may include a first electrode 210, a second electrode 220, a first insulating layer 510, and a light-emitting element 300. The first electrode 210, the second electrode 220, and the light-emitting element 300 are as described above.

The first insulating layer 510 may be disposed to cover the first electrode 210 and the second electrode 220, and the light-emitting element 300 may be disposed on the first insulating layer 510 and between the first electrode 210 and the second electrode 220. In the drawings, opposite ends of the light-emitting element 300 are located at positions overlapping the first electrode 210 and the second electrode 220, respectively, but embodiments according to the invention are not limited thereto.

According to an embodiment, the first insulating layer 510 may include a second sub-insulating layer 513 and a first sub-insulating layers 511 and 512. The first sub-insulating layers 511 and 512 may include a first portion 511 on a region of the second sub-insulating layer 513, and a second portion 512 which is a region except for the first portion 511. The second sub-insulating layer 513 may be located across the first region IR1 and the second region IR2 to cover the first electrode 210 and the second electrode 220. The second sub-insulating layer 513 may be disposed in direct contact with the first electrode 210 and the second electrode 220 and extend to a neighboring sub-pixel PXn.

The first portion 511 may be disposed on a region of the second sub-insulating layer 513. The first portion 511 may be disposed on a part of the first electrode 210 disposed in each sub-pixel PXn and the second electrode 220. The first portion 511 may be provided only in each sub-pixel PXn. In the drawings, it is illustrated that the first portion 511 overlaps a region of a cross section of the first electrode 210, i.e., half the first electrode 210, and covers an entire cross section of the second electrode 220. That is, the first portion 511 may be provided to overlap only a side of the first electrode 210 facing the second electrode 220 and overlap opposite sides of the second electrode 220 facing the first electrode 210. However, embodiments according to the invention are not limited thereto, and the first portion 511 may be formed to overlap the entire first electrode 210 or overlap a part of the second electrode 220 in another embodiment. The region in which the first portion 511 is disposed may form a first region IR1. A plurality of light-emitting elements 300 may be disposed on the first portion 511 in the first region IR1.

The second portion 512 may be provided in a region of the second sub-insulating layer 513 in which the first portion 511 is not disposed. The second portion 512 may be disposed on a boundary of a neighboring sub-pixel PXn and may extend to the neighboring sub-pixel PXn to connect one sub-pixel PXn to the neighboring sub-pixel PXn when the second portion 512 is located in one sub-pixel PXn. As illustrated in FIG. 6, only the second sub-insulating layer 513 and the second portion 512 may be provided in a region between the first electrode 210 in one sub-pixel PXn and the first electrode 210 in another sub-pixel PXn. The region in which the second portion 512 is provided may form a second region IR2, and the light-emitting elements 300 may not be substantially disposed on the second portion 512. That is, in an embodiment, the density of the light-emitting elements 300 disposed in the first region IR1 or the first portion 511 may be higher than the density of the light-emitting elements 300 disposed in the second region IR2 or the second portion 512.

The first portion 511 may include a hydrophilic material, and the second portion 512 may include a hydrophobic material. That is, regions having different polarities may be formed on an upper surface of the first insulating layer 510. According to an embodiment, during the manufacturing process of the display device 10, the ink S in which the light-emitting elements 300 are dispersed may be induced to be moved to only a certain region, e.g., the first portion 511 including the hydrophilic material, among the regions having different polarities on the first insulating layer 510.

As shown in FIG. 5, in the manufacturing process of the display device 10, the ink S in which the light-emitting elements 300 are dispersed may be sprayed onto the first electrode 210 and the second electrode 220. In an embodiment, the first portion 511 forming the first region IR1 may prevent movement of the ink S to the second portion 512. The ink S sprayed onto each sub-pixel PXn may be sprayed into the first region IR1 and maintained at an initial position, and the ink S sprayed into the second region IR2 other than the first region IR1 may form a strong attractive force with the first portion 511 including the hydrophilic material and thus be moved into the first region IR1. Thus, the number of the light-emitting elements 300 between the first electrode 210 and the second electrode 220 among the light-emitting elements 300 dispersed in the ink S may increase.

An ink S spread prevention function of the first insulating layer 510 may be derived by controlling the differences in surface energy between the first and second portions 511 and 512 of the first insulating layer 510 and the ink S. As described above, the first portion 511 may include the hydrophilic material, the second portion 512 may include the hydrophobic material, and the difference in surface energy between the first portion 511 and the ink S may be different from the difference in surface energy between the second portion 512 and the ink S.

The ink S sprayed onto the first insulating layer 510 may be in a form appropriate for minimizing surface energy. The ink S may be in a spherical or semi-elliptical form to minimize surface energy.

Here, a case in which the ink S is provided on the first portion 511, i.e., in the first region IR1, will be described as an example. The ink S may be provided at a boundary between the first and second portions 511 and 512 to form an interface between the first portion 511 and the ink S and an interface between the ink S and the air. The ink S may have surface energy at the above interfaces and may exhibit behavior for minimizing a value of the surface energy.

In an embodiment, for example, when the ink S is positioned on the first portion 511 forming the first region IR1, the ink S may have a first force F1 that moves in a random direction due to the movement of a fluid. The first force F1 may be a force due to the movement of the fluid contained in the ink S, a force due to gravity acting on the ink S, or a force applied to minimize surface energy of the ink S. The first force F1 may be applied such that the sum of a level of first surface energy (γSV) between the ink S and the first portion 511 and a level of second surface energy (γSV) between the ink S and the air is minimized. As illustrated in FIG. 5, when the level of the first surface energy (γSV) between the ink S and the first portion 511 is smaller than the level of the second surface energy (γSV) between the ink S and the air, the ink S may be moved due to the first force F1 applied thereto to increase the interface between the ink S and the first portion 511.

When the ink S is positioned between the first region IR1 and the second region IR2 and moved to the second region IR2 by the first force F1, a new interface may be formed between the ink S and the second portion 512. However, when a level of third surface energy (γSV') formed at the interface between the ink S and the second portion 512 is large, total surface energy of a surface of the ink S may increase. To prevent this problem, a force, i.e., a second force F2, applied to minimize the interface between the ink S and the second portion 512 is applied to the ink S. When the second force F2 applied to the ink S is greater than the first force F1, the ink S may not be moved at the boundary between the first portion 511 and the second portion 512. As described above, in the manufacturing process of the display device 10 according to an embodiment, the ink S in which the light-emitting elements 300 are dispersed may be induced to be positioned in a certain region, for example, the first region IR1. That is, the spread of the ink S sprayed onto each sub-pixel PXn to regions other than the first region IR1 may be prevented. Accordingly, the light-emitting elements 300 dispersed in the ink S may be induced to be positioned only in the first region IR1 and the number of the light-emitting elements 300 between the electrodes 210 and 220 in the first region IR1 may be increased.

Furthermore, as shown in FIG. 6, the second region IR2 may be formed between different sub-pixels PXn to prevent the spread of the ink S to neighboring sub-pixels PXn even when members that separates sub-pixels PXn from each other are not provided. When different types of light-emitting elements 300 are disposed for sub-pixels PXn, it is necessary to prevent light-emitting elements 300 to be disposed in a specific sub-pixel PXn from being disposed in another sub-pixel PXn in the manufacturing process of the display device 10. Here, in the display device 10 according to an embodiment, the second region IR2 may be formed between neighboring sub-pixels PXn so that different types of light-emitting elements 300 may be disposed in the sub-pixels PXn even when an additional member is not provided.

According to an embodiment, the first portion 511 may include a hydrophilic material and the second portion 512 may include a hydrophobic material. When the ink S in which the light-emitting elements 300 are dispersed includes a hydrophilic solvent, the second force F2 applied to the ink S at the boundary between the first portion 511 and the second portion 512 may be greater than the first force F1 and thus the spread of the ink S into the sub-pixels PXn may be prevented. However, the polarities of the materials included in the first portion 511 and the second portion 512 according to the invention are not limited thereto. In the manufacturing process of the display device 10, the polarities of the materials included in the first portion 511 and the second portion 512 may be reversed according to the polarity of the ink S in which the light-emitting elements 300 are dispersed.

In an embodiment, the first portion 511 may include a material having a contact angle of 30 degrees (°) or less or 5° or less with respect to water, and the second portion 512 may include a material having a contact angle 80° or more or 150° or more with respect to water. When the ink S in which the light-emitting elements 300 are dispersed is hydrophilic, the first portion 511 may also include a hydrophilic material and the second portion 512 may include a hydrophobic material, thereby preventing the spread of the ink S to regions other than the first region IR1. However, embodiments according to the invention are not limited thereto, and the polarities of the material of the first portion 511 and the material of the second portion 512 may be opposite to each other as described above in another embodiment.

Alternatively, the light-emitting elements 300 may be also provided on a region of each sub-pixel PXn other than the first region IR1. In some cases, some light-emitting elements 300 may be provided only on the second region IR2. In the display device 10 according to an embodiment, a density of the light-emitting elements 300 disposed in the first region IR1 may be higher than that of the light-emitting elements 300 disposed on the second region IR2.

In the manufacturing process of the display device 10, the above-described structure of the first insulating layer 510 may be obtained by forming the first insulating layer 510 and emitting different types of plasma to the first insulating layer 510 to form the first portion 511, the second portion 512, and the second sub-insulating layer 513. The first portion 511 may be formed by emitting a first plasma (see FIG. 12) to the first insulating layer 510, the second portion 512 may be formed by emitting a second plasma (see FIG. 14) to the first insulating layer 510, and the second sub-insulating layer 513 may be formed in a region of the first insulating layer 510 to which no plasma is emitted.

According to an embodiment, the first insulating layer 510 may include an inorganic insulating material. For example, the first insulating layer 510 may include silicon oxycarbide ($SiOC_x$). The first insulating layer 510 may include silicon oxycarbide and thus contain a silicon-oxygen (Si—O) bond and a silicon-carbon (Si—C) bond. Here, when a plasma is emitted, the silicon-carbon (Si—C) bond may be broken and another bond may be formed by the emitted plasma. In an embodiment, in the manufacturing process of the display device 10, the first plasma and the second plasma emitted to the first insulating layer 510 may be, respectively, a fluorine (F)-based plasma and an oxygen-based plasma. Accordingly, the first portion 511 may contain a silicon-oxygen (Si—O) bond formed due to the emission of the second plasma and the second portion 512 may contain a silicon-fluoromethyl (Si-CNFM) bond formed by the emission of the first plasma. The second sub-insulating layer 513 may be a region to which the plasmas are not emitted and which includes the same material as the first insulating layer 510.

According to an embodiment, the first insulating layer 510 may include silicon oxycarbide (SiOCx), and thus regions containing different bonds may be formed by plasma emitted to the silicon oxycarbide (SiOCx). That is, the silicon-fluoromethyl (Si-CnFm) bond may be formed by emitting the first plasma to silicon oxycarbide (SiOCx), and the silicon-oxygen (Si—O) bond may be formed by emitting the second plasma. Silicon (Si) contained in silicon oxycarbide (SiOCx) may be broken from a bond regardless of the types of elements of the bond and a new bond may be formed when plasma is emitted to the bond. In other words, an upper surface of the first insulating layer 510 may be surface-modified selectively or reversibly when the first or second plasma is emitted thereto. This will be described below.

The first portion 511 may contain a silicon-oxygen (Si—O) bond or a silicon-hydroxide (Si—OH) bond and thus may have hydrophilic polarity and a small contact angle to water. In contrast, the second portion 512 may contain a silicon-fluoromethyl (Si-CNFM) bond and thus may have hydrophobic polarity and a high contact angle to the water. Accordingly, in the manufacturing process of the display device 10, the ink S sprayed onto the first insulating layer 510 may be induced to be located in the first region IR1 in which the first portion 511 having the hydrophilic polarity is formed.

The first insulating layer 510 may be in a form, in which the first portion 511 and the second portion 51 containing different bonds are formed in some regions by emitting the first or second plasma to substantially one insulating layer. Although in the drawings, the first portion 511, the second portion 512, and the second sub-insulating layer 513 are illustrated as different layers, embodiments according to the invention are not limited thereto. The first insulating layer 510 may be formed such that the first portion 511, the second portion 512, and the second sub-insulating layer 513 are integrally formed and a composition ratio of materials or the types of bonds may vary according to a position thereof. In some cases, the first insulating layer 510 may include the first portion 511 formed by disposing a layer including a hydrophilic material on the second sub-insulating layer 513 and include the second portion 512 formed by disposing a layer including a hydrophobic material on a region of the second sub-insulating layer 513 except for the first portion 511.

In an embodiment, the first insulating layer 510 may include the second sub-insulating layer 513, the first portion 511 that is higher in oxygen (O) atom content than the second sub-insulating layer 513, and the second portion 512 that is higher in fluorine (F) atom content than the second sub-insulating layer 513 and the first portion 511. Alternatively, the content of oxygen (O) atoms of the first insulating layer 510 in the first region IR1 may increase from a lower region to an upper region, and the content of fluorine (F) atoms thereof in the second region IR2 may increase from the lower region to the upper region. The lower region of the first insulating layer 510 may be the second sub-insulating layer 513. The upper region of the first insulating layer 510, which is higher in oxygen (O) atom content, in the first region IR1 may be the first portion 511, and the upper region of the first insulating layer 510, which is higher in fluorine (F) atom content, in the second region IR2 may be the second portion 512.

The first insulating layer 510 according to an embodiment may include silicon oxycarbide (SiOCx), and include the first portion 511, which is higher in oxygen (O) atom content than other regions, and the second portion 512, which is higher in fluorine (F) atom content than other regions. Because the first portion 511, which is higher in oxygen (O) atom content, is hydrophilic and the second portion 512, which is higher in fluorine (f) atom content, is hydrophobic, the ink S sprayed onto the first insulating layer 510 may be induced to be positioned on a certain region, e.g., the first portion 511.

In some embodiments, a contact electrode 260 of FIG. 7 may be disposed on the first electrode 210 and the second electrode 220. The contact electrode 260 may be disposed substantially on the first insulating layer 510, and at least a portion thereof may be in contact with or electrically connected to the first electrode 210 and the second electrode 220.

FIG. 7 is a cross-sectional view schematically illustrating a partial cross section of a display device according to an embodiment.

Referring to FIG. 7, a first insulating layer 510 according to an embodiment may be formed to expose at least a portion of a first electrode 210 and a portion of a second electrode 220, and the display device 10 may further include the contact electrode 260 in contact with the first electrode 210 and the second electrode 220, which are exposed through an opening. The first insulating layer 510 may be disposed to cover the electrodes 210 and 220, and the opening may be formed to overlap the electrodes 210 and 220 to expose some regions of the electrodes 210 and 220. As shown in the drawings, the opening may entirely expose flat top surfaces of the electrodes 210 and 220 and partially expose inclined sides of the electrodes 210 and 220. However, embodiments according to the invention are not limited thereto. The opening defined in the first insulating layer 510 may expose only part of the upper surfaces of the electrodes 210 and 220.

The contact electrode 260 is disposed on the electrodes 210 and 220. The contact electrode 260 may be in contact with the regions of the electrodes 210 and 220, which are exposed through the opening, and at least one end of a light-emitting element 300. The contact electrode 260 includes a first contact electrode 261 on the first electrode 210 and a second contact electrode 262 on the second electrode 220. The first contact electrode 261 may be in contact with the exposed region of the first electrode 210 and one end of the light-emitting element 300, and the second contact electrode 262 may be in contact with the exposed region of the second electrode 220 and another end of the light-emitting element 300.

As shown in FIG. 7, the opening of the first insulating layer 510 may expose at least portions of sides of the first and second electrodes 210 and 220, as well as the upper surfaces thereof. In this case, an area of the electrodes 210 and 220 exposed through the opening may increase and the contact electrode 260 may be in contact with larger regions of the electrodes 210 and 220. Accordingly, contact resistance between the contact electrode 260 and the electrodes 210 and 220 may decrease.

In the manufacturing process of the display device 10, after forming the first insulating layer 510 covering the entire electrodes 210 and 220, the light-emitting element 300 may be aligned within a first region IR1. Thereafter, the opening for exposing portions of the electrodes 210 and 220 may be formed in the first insulating layer 510, the contact electrode 260 may be formed in contact with at least one end of the light-emitting element 300 and at least regions of the electrodes 210 and 220. Even when the electrodes 210 and 220 are entirely covered with the first insulating layer 510, an electrical signal may be transmitted from the electrodes 210 and 220 to the light-emitting element 300 through the contact electrode 260, because the display device 10 according to an embodiment further includes the contact electrode 260 in contact with the regions of the electrodes 210 and 20 exposed through the opening and the light-emitting element 300.

In an embodiment, the first contact electrode 261 may be in contact with the first electrode 210 and one end of the light-emitting element 300, and the second contact electrode 262 may be in contact with the second electrode 220 and another end of the light-emitting element 300. The light emitting element 300 may be in a form extending in one direction, and opposite ends thereof in the direction may be in contact with the first contact electrode 261 and the second contact electrode 262, respectively. The contact electrode 260 may be also in contact with a region of sides of the light-emitting element 300 adjacent to opposite ends of the light-emitting element 300, as well as the opposite ends of the light-emitting element 300. That is, the contact electrode 260 may be in contact with the light-emitting element 300 to surround the opposite ends of the light-emitting element 300. However, embodiments according to the invention are not limited thereto.

However, the structure of the display device 10 according to the invention is not limited to that illustrated in FIGS. 3 to 7, and the display device 10 may have a structure different from that illustrated in FIGS. 3 to 7 or a larger number of components may be disposed on the circuit element layer PAL in another embodiment. Although not shown in the drawings, the display device 10 may include the circuit element layer PAL below the electrodes 210 and 220, the second insulating layer 520 of FIG. 8, which is disposed to cover at least a portion of the light-emitting element 300, and the electrodes 210 and 220, and a passivation layer 550 of FIG. 8. The structure of the display device 10 will be described in detail with reference to FIG. 8 below.

FIG. 8 is a cross-sectional view taken along lines Xa-Xa', Xb-Xb' and Xc-Xc' of FIG. 2.

FIG. 8 illustrates only a cross section of the first sub-pixel PX1 but may apply to other pixels PX or sub-pixels PXn. FIG. 8 illustrates a cross section crossing one end and another end of a light-emitting element 300.

Referring to FIGS. 2 and 8, the display device 10 may include a circuit element layer PAL and an emission layer EML. The circuit element layer PAL may include a substrate 110, a buffer layer 115, a light blocking layer BML, a first transistor 120, a second transistor 140, or the like, and the emission layer EML may include a plurality of electrodes 210 and 220, a light-emitting element 300, and the plurality of insulating layers 510, 520 and 550, or the like, which are disposed on the first and second transistors 120 and 140.

The substrate 110 may be an insulating substrate. The substrate 110 may be formed of an insulating material such as glass, quartz, or polymer resin. The substrate 110 may be a rigid substrate but may be a flexible substrate capable of being bent, folded or rolled.

The light blocking layer BML may be provided on the substrate 110. The light blocking layer BML may include a first light blocking layer BML1 and a second light blocking layer BML2. The first light blocking layer BML1 may be electrically connected to a first drain electrode 123 of the first transistor 120 to be described below. The second light blocking layer BML2 may be electrically connected to a second drain electrode 143 of the second transistor 140.

The first light blocking layer BML1 and the second light blocking layer BML2 are disposed to overlap a first active material layer 126 of the first transistor 120 and a second active material layer 146 of the second transistor 140, respectively. The first and second light blocking layers BML1 and BML2 may include a material blocking light and thus prevent light from being incident on the first and second active material layers 126 and 146. For example, the first and second light blocking layers BML1 and BML2 may be formed of an opaque metal material capable of blocking light. However, embodiments according to the invention are not limited thereto, and the light blocking layer BML may be omitted in some cases.

The buffer layer 115 is disposed on the light blocking layer BML and the substrate 110. The buffer layer 115 may be disposed to entirely cover the substrate 110, including the light blocking layer BML. The buffer layer 115 may prevent the diffusion of impurity ions, prevent the permeation of moisture or external air, and perform a surface planarization function. In addition, the buffer layer 115 may insulate the light blocking layer BML and the first and second active material layers 126 and 146 from one another.

A semiconductor layer is disposed on the buffer layer 115. The semiconductor layer may include the first active material layer 126 of the first transistor 120, the second active material layer 146 of the second active material layer 146, and an auxiliary layer 163. The semiconductor layer may include polycrystalline silicon, monocrystalline silicon, an oxide semiconductor, or the like.

The first active material layer 126 may include a first doped region 126a, a second doped region 126b, and a first channel region 126c. The first channel region 126c may be disposed between the first doped region 126a and the second doped region 126b. The second active material layer 146 may include a third doped region 146a, a fourth doped region 146b, and a second channel region 146c. The second channel region 146c may be disposed between the third doped region 146a and the fourth doped region 146b. The first active material layer 126 and the second active material layer 146 may include polycrystalline silicon. The polycrystalline silicon may be formed by crystallizing amorphous silicon. Examples of a method of crystallizing amorphous silicon may include, but are not limited to, a rapid thermal annealing ("RTA") method, a solid phase crystallization ("SPC") method, an excimer laser annealing ("ELA") method, a metal induced crystallization ("MILC") method, a sequential lateral solidification ("SLS") method, etc. As another example, the first active material layer 126 and the second active material layer 146 may include monocrystalline silicon, low-temperature polycrystalline silicon, amorphous silicon, or the like. Each of the first doped region 126a, the second doped region 126b, the third doped region 146a, and the fourth doped region 146b may be a region of the first or second active material layer 126 or 146, which is doped with impurities. However, embodiments according to the invention are not limited thereto.

A first gate insulating film 150 is disposed on the semiconductor layer. The first gate insulating film 150 may be disposed to cover the entire buffer layer 115, including the semiconductor layer. The first gate insulating film 150 may function as a gate insulating film of the first and second transistors 120 and 140.

A first conductive layer is disposed on the first gate insulating film 150. On the first gate insulating film 150, the first conductive layer may include a first gate electrode 121 on the first active material layer 126 of the first transistor 120, a second gate electrode 141 on the second active material layer 146 of the second transistor 140, and a power supply interconnection 161 on the auxiliary layer 163. The first gate electrode 121 may overlap the first channel region 126c of the first active material layer 126, and the second gate electrode 141 may overlap the second channel region 146c of the second active material layer 146.

An interlayer insulating film 170 is disposed on the first conductive layer. The interlayer insulating film 170 may perform a function of an interlayer insulating film. The interlayer insulating film 170 may include an organic insulating material and perform a surface planarization function.

A second conductive layer is disposed on the interlayer insulating film 170. The second conductive layer includes a first drain electrode 123 and a first source electrode 124 of the first transistor 120, a second drain electrode 143 and a second source electrode 144 of the second transistor 140, and a power electrode 162 disposed on the power supply interconnection 161.

The first drain electrode 123 and the first source electrode 124 may be in contact with the first doped region 126a and the second doped region 126b of the first active material layer 126, respectively, through contact holes passing through the interlayer insulating film 170 and the first gate insulating film 150. The second drain electrode 143 and the second source electrode 144 may be in contact with the third doped region 146a and the fourth doped region 146b of the second active material layer 146, respectively, through the contact holes passing through the interlayer insulating film 170 and the first gate insulating film 150. The first drain electrode 123 and the second drain electrode 143 may be electrically connected to the first light blocking layer BML1 and the second light blocking layer BML2 through another contact hole, respectively.

A via layer 200 is disposed on the second conductive layer. The via layer 200 may include an organic insulating material and perform the surface planarization function.

A plurality of banks 410 and 420, a plurality of electrodes 210 and 220, and a light-emitting element 300 may be disposed on the via layer 200.

The plurality of banks 410 and 420 may be disposed in each sub-pixel PXn to be spaced apart from each other. The plurality of banks 410 and 420 may include a first bank 410 and a second bank 420 disposed adjacent to a central portion of each sub-pixel PXn.

The first bank 410 and the second bank 420 are arranged to face each other while being spaced apart from each other. The first electrode 210 may be disposed on the first bank 410, and the second electrode 220 may be disposed on the second bank 420. Referring to FIGS. 2 and 8, it may be understood that the first electrode branch portion 210B is disposed on the first bank 410 and the second electrode branch portion 220B is disposed on the second bank 420.

The first bank 410 and the second bank 420 may be disposed in each sub-pixel PXn to extend in a second direction DR2. Although not shown in the drawings, the first bank 410 and the second bank 420 may extend in the second direction DR2 and thus may extend toward a sub-pixel PXn adjacent in the second direction DR2. However, embodiments according to the invention are not limited thereto, and the first bank 410 and the second bank 420 may be disposed for each sub-pixel PXn to form a pattern on a front surface of the display device 10 in another embodiment. The first bank 410 and the second bank 420 may include polyimide ("PI") but are not limited thereto.

The first bank 410 and the second bank 420 may each have a structure in which at least a portion protrudes with respect to the via layer 200. The first bank 410 and the second bank 420 may protrude upward with respect to a plane in which the light-emitting element 300 is disposed, and at least part of protruding portions thereof may be inclined. A shape of the protruding portions of the first bank 410 and the second bank 420 is not particularly limited.

According to an embodiment, the banks 410 and 420 may not be disposed at a boundary between neighboring sub-pixels PXn. For example, a flat surface may be formed between a first sub-pixel PX1 and a second sub-pixel PX2 rather than the banks 410 and 420 extending in the second direction DR2. As described above, in each sub-pixel PXn, the first insulating layer 510 including the plurality of sub-insulating layers 511, 512, and 513 may be disposed and the first region IR1 and the second region IR2 having different polarities may be defined. In the manufacturing process of the display device 10, when an organic material or solvent is sprayed onto each sub-pixel PXn by an inkjet printing method, the organic material or solvent may be positioned in the first region IR1 of each sub-pixel PXn even when the banks 410 and 402 are not disposed at boundaries between sub-pixels PXn. In each sub-pixel PXn, the first insulating layer 510 including the plurality of sub-insulating layers 511, 512, and 513 may be disposed and the sprayed organic material or solvent may be prevented from flowing into adjacent sub-pixels PXn even when the banks 410 and 420 are not provided at the boundaries between neighboring sub-pixels PXn. This is as described in detail with reference to FIG. 5 above.

The plurality of electrodes 210 and 220 may be disposed on the via layer 200 and the banks 410 and 420. As described above, the electrodes 210 and 220 include the electrode stem portions 210S and 220S and the electrode branch portions 210B and 220B. In FIG. 2, the line Xa-Xa' cross the first electrode stem portion 210S, the line Xb-Xb' crosses the first and second electrode branch portions 210B and 220B, and the line XC-XC' crosses the second electrode stem portion 220S. That is, it may be understood that the first electrode 210 disposed in a region indicated by the line Xa-Xa' of FIG. 8 corresponds to the first electrode stem portion 210S. The first electrode 210 and the second electrode 220 disposed in a region indicated by the line Xb-Xb' correspond to the first electrode branch portion 210B and the second electrode branch portion 220B, respectively. The second electrode 220 disposed in a region indicated by the line Xc-Xc' corresponds to the second electrode stem portion 220S. The electrode stem portions 210S and 220S and the electrode branch portions 210B and 220B may form the first electrode 210 and the second electrode 220.

Some regions of the first electrode 210 and the second electrode 220 may be provided on the via layer 200, and some regions thereof may be provided on the first bank 410 and the second bank 420. As described above, the first electrode stem portion 210S of the first electrode 210 and the second electrode stem portion 220S of the second electrode 220 may extend in the first direction DR1, and the first bank 410 and the second bank 420 may extend in the second direction DR2 to be also placed in a sub-pixel PXn adjacent to the second direction DR2. Although not shown in the drawings, the first electrode stem portion 210S of the first electrode 210 and the second electrode stem portion 220S of the second electrode 220, which extend in the first direction DR1, may partially overlap the first and second banks 410 and 420. However, embodiments according to the invention are not limited thereto, and the first electrode stem portion 210S and the second electrode stem portion 220S may not overlap the first bank 410 and the second bank 420 in another embodiment.

A first electrode contact hole CNDT may be formed in the first electrode stem portion 210S of the first electrode 210 to pass through the via layer 200 and partially expose the first drain electrode 123 of the first transistor 120. The first electrode 210 may be in contact with the first drain electrode 123 through the first electrode contact hole CNTD. The first electrode 210 may be electrically connected to the first drain electrode 123 of the first transistor 120 to receive a certain electrical signal.

The second electrode stem portion 220S of the second electrode 220 may extend in one direction to be placed in a non-emission area in which light-emitting elements 300 are not disposed. A second electrode contact hole CNTS may be formed in the second electrode stem portion 220S to pass through the via layer 200 and partially expose the power electrode 162. The second electrode 220 may be in contact with the power electrode 162 via the second electrode contact hole CNTS. The second electrode 220 may be electrically connected to the power electrode 162 to receive a certain electrical signal from the power electrode 162.

Some regions, e.g., the first electrode branch portion 210B and the second electrode branch portion 220B, of the first electrode 210 and the second electrode 220 may be located on the first bank 410 and the second bank 420, respectively. The first electrode branch portion 210B of the first electrode 210 may be disposed to cover the first bank 410, and the second electrode portion 220B of the second electrode 220 may be disposed to cover the second bank 420. Because the first bank 410 and the second bank 420 are disposed spaced apart from each other with respect to the center of each sub-pixel PXn, the first electrode branch portion 210B and the second electrode branch portion 220B may be also spaced apart from each other. A plurality of light-emitting elements 300 may be disposed in a region between the first electrode 210 and the second electrode 220, i.e., a space between the first electrode branch portion 210B and the second electrode branch portion 220B facing each other while being spaced apart from each other.

The electrodes 210 and 220 may include a transparent conductive material. For example, the electrode 210 and 220 may include a material such as indium tin oxide ("ITO"), indium zinc oxide ("IZO") or indium tin-zinc oxide ("ITZO") but embodiments according to the invention are not limited thereto. In some embodiments, the electrodes 210 and 220 may include a conductive material having high reflectivity. For example, the electrodes 210 and 220 may include a metal, such as silver (Ag), copper (Cu) aluminum (AL), as the material having high reflectivity. In this case, light incident on the electrodes 210 and 220 may be reflected and emitted in an upward direction of each sub-pixel PXn.

The electrodes 210 and 220 may be formed by alternately stacking at least one transparent conductive material and at least one metal layer having higher reflectivity or forming a transparent conductive material and a metal layer having higher reflectivity in one layer. In an embodiment, the electrodes 210 and 220 may have a stacked structure of ITO/silver (Ag)/ITO/IZO or may be an alloy containing aluminum (AL), nickel (Ni), lanthanum (LA), etc. However, embodiments according to the invention are not limited thereto.

The first insulating layer 510 is disposed on the via layer 200, the first electrode 210, and the second electrode 220. The first insulating layer 510 is disposed to partially cover the first electrode 210 and the second electrode 220. The first insulating layer 510 is disposed to cover a great part of upper surfaces of the first electrode 210 and the second electrode 220 while partially exposing the first electrode 210 and the second electrode 220. The first insulating layer 510 may be disposed to expose portions of the upper surfaces of the first and second electrodes 210 and 220, e.g., portions of an upper surface of the first electrode branch portion 210B on the first bank 410 and an upper surface of the second electrode branch portion 220B on the second bank 420. That is, the first insulating layer 510 may be formed on substantially an entire via layer 200 and include an opening to partially expose the first electrode 210 and the second electrode 220. The opening of the first insulating layer 510 may be positioned to expose relatively flat upper surfaces of the first electrode 210 and the second electrode 220.

In an embodiment, in the first insulating layer 510, a flat upper surface may be provided to dispose the light-emitting element 300 between the first electrode 210 and the second electrode 220. The upper surface may extend in a direction toward the first electrode 210 and the second electrode 220 and end at inclined sides of the first electrode 210 and the second electrode 220. That is, the first insulating layer 510 may be disposed in a region in which the electrodes 210 and 220 overlap the inclined sides of the first bank 410 and the second bank 420. The contact electrode 260 described below may be in contact with the exposed regions of the first electrode 210 and the second electrode 220 and may be in smooth contact with an end of the light-emitting element 300 on the flat upper surface of the first insulating layer 510.

However, embodiments according to the invention are not limited thereto. The upper surface of the first insulating layer 510 disposed between the first electrode 210 and the second electrode 220 spaced apart from each other may not be flat but may be stepped. When the light-emitting element 300 is disposed on the first insulating layer 510, a space may be formed between a lower surface of the light-emitting element 300 and a stepped region of the first insulating layer 510. The light-emitting element 300 may be disposed to be partially spaced from the upper surface of the first insulating layer 510, and the space may be filled with a material of the second insulating layer 520 to be described below.

The first insulating layer 510 may protect the first electrode 210 and the second electrode 220 while insulating them from each other. In addition, the first insulating layer 510 may prevent the light-emitting element 300 disposed thereon from being damaged due to direct contacted with other members. However, a shape and structure of the first insulating layer 510 according to the invention are not limited thereto.

The first insulating layer 510 may include the first portion 511, the second portion 512, and the second sub-insulating layer 513 as described above. The second sub-insulating layer 513 may be disposed to cover the first bank 410, the second bank 420, the first electrode 210, and the second electrode 220, including the via layer 200. That is, the second sub-insulating layer 513 may be disposed in substantially the same form as the first insulating layer 510. Although not shown in FIG. 8, the first region IR1 may be formed in a region in which the first portion 511 of the insulating layer 510 is provided and the second region IR2 may be formed in a remaining region in which the second portion 512 is provided. This is as described above and thus a detailed description thereof will be omitted.

The light-emitting element 300 may be disposed on the first insulating layer 510 between the electrodes 210 and 220. For example, at least one light-emitting element 300 may be disposed on the first insulating layer 510 between the electrode branch portions 210B and 220B, i.e., on the first portion 511 forming the first region IR1. However, embodiments according to the invention are not limited thereto, and although not shown in the drawings, at least some of the light-emitting elements 300 disposed in each sub-pixel PXn may be disposed in the second region IR2. In the display device 10 according to an embodiment, a great part of the light-emitting elements 300 in each sub-pixel PXn may be disposed in the first region IR1 and only some light-emitting elements 300 may be disposed in the second region IR2. Alternatively, some regions of the light-emitting element 300 may be disposed at a position overlapping the electrodes 210 and 220. Each of the light-emitting elements 300 may be disposed on one of ends of the first and second electrode branch portions 210B and 220B facing each other and may be electrically connected to the electrodes 210 and 220 through the contact electrode 260.

Figure 9:
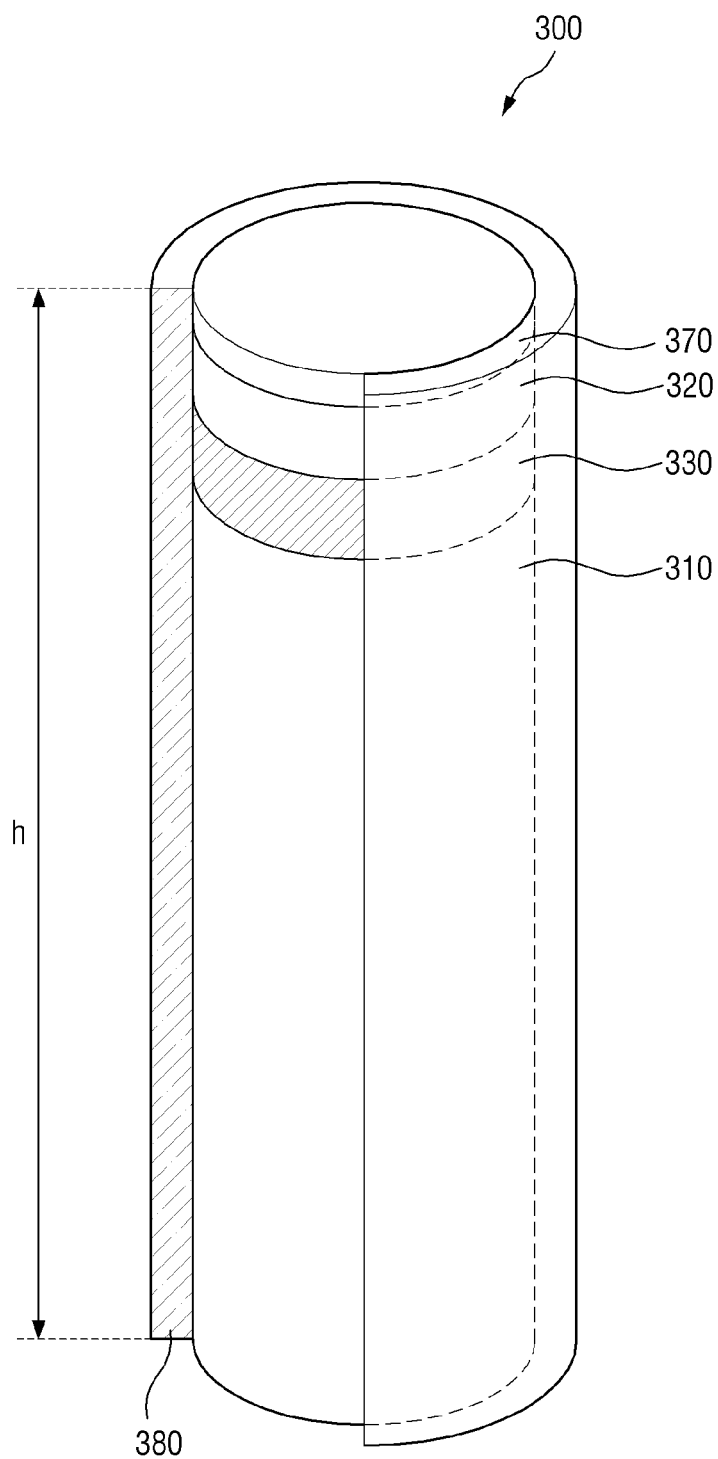
FIG. 9 is a schematic diagram of a light-emitting element according to an embodiment.

The light-emitting element 300 include a plurality of layers disposed in a horizontal direction with respect to the via layer 200. The light-emitting element 300 of the display device 10 according to an embodiment may include a first semiconductor layer 310, a second semiconductor layer 320, and an active layer 330, which are illustrated in FIG. 9 and may be sequentially arranged in the horizontal direction with respect to the via layer 200. As shown in the drawings, the first semiconductor layer 310, the second semiconductor layer 320, and the active layer 330 may be sequentially arranged in the light-emitting element 300 in the horizontal direction with respect to the via layer 200. However, embodiments according to the invention are not limited thereto. An order in which the plurality of layers of the light-emitting element 300 are arranged may be opposite to that described above, and the plurality of layers of the light-emitting element 300 may be arranged in a direction perpendicular to the via layer 200 when the light-emitting element 300 has a different structure in some cases.

The second insulating layer 520 may be partially disposed on the light-emitting element 300. The second insulating layer 520 may be disposed to partially cover an outer surface of the light-emitting element 300. The second insulating layer 520 may perform a function of fixing the light-emitting element 300 in the manufacturing process of the display device 10 while protecting the light-emitting element 300. In an embodiment, some materials of the second insulating layer 520 may be disposed between a lower surface of the light-emitting element 300 and the first insulating layer 510. As described above, the second insulating layer 520 may be formed to fill a space between the first insulating layer 510 and the light-emitting element 300 which is generated in the manufacturing process of the display device 10. Accordingly, the second insulating layer 520 may be formed to cover the outer surface of the light-emitting element 300. However, embodiments according to the invention are not limited thereto.

The second insulating layer 520 may extend and disposed in the second direction DR2 on a plane between the first electrode branch portion 210B and the second electrode branch portion 220B. For example, the second insulating layer 520 may be in an island or linear form on a plane on the via layer 200.

The contact electrode 260 is disposed on the electrodes 210 and 220 and the second insulating layer 520. The first contact electrode 261 and the second contact electrode 262 may be disposed on the second insulating layer 520 to be spaced apart from each other. The second insulating layer 520 may insulate the first and second contact electrodes 261 and 262 from each other so as not to be in contact with each other.

Although not shown in the drawings, a plurality of contact electrodes 260 may extend on a plane in the second direction DR2 to be spaced apart from each other in the first direction DR1. The contact electrode 260 may be in contact with at least one end of the light-emitting element 300 and electrically connected to the first electrode 210 or the second electrode 220 to receive an electrical signal. The contact electrode 260 may include the first contact electrode 261 and the second contact electrode 262. The first contact electrode 261 may be disposed on the first electrode branch portion 210B to be in contact with one end of the light-emitting element 300, and the second contact electrode 262 may be disposed on the second electrode branch portion 220B to be in contact with another end of the light-emitting element 300.

The first contact electrode 261 may be in contact with an exposed region of the first electrode 210 on the first bank 410, and the second contact electrode 262 may be in contact with an exposed region of the second electrode 220 on the second bank 420. The contact electrode 260 may transmit electrical signals transmitted from the electrodes 210 and 220 to the light-emitting element 300.

The contact electrode 260 may include a conductive material. For example, the contact electrode 260 may include ITO, IZO, ITZO, aluminum (AL), or the like. However, embodiments according to the invention are not limited thereto.

The passivation layer 550 may be disposed on the first contact electrode 261, the second contact electrode 262, and the second insulating layer 520. The passivation layer 550 may protect the members disposed on the via layer 200 from an external environment.

Each of the second insulating layer 520 and the passivation layer 550 described above may include an inorganic or organic insulating material. In an embodiment, the second insulating layer 520 and the passivation layer 550 may include an inorganic insulating layer, such as silicon oxide (SiOx), silicon nitride (SiNx), silicon oxynitride (SiOxNy), aluminum oxide (Al2O3), or aluminum nitride (AlN). The second insulating layer 520 and the passivation layer 550 may include, as an organic insulating material, acrylic resin, epoxy resin, phenol resin, polyamide resin, polyimide resin, unsaturated polyester resin, polyphenylene resin, polyphenylene sulfide resin, benzocyclobutene, cardo resin, siloxane resin, silsesquioxane resin, polymethyl methacrylate, polycarbonate, polymethyl methacrylate-polycarbonate synthetic resin, or the like. However, embodiments according to the invention are not limited thereto.

The light-emitting element 300 may be a light-emitting diode, and particularly, an inorganic light-emitting diode formed of an inorganic material. The inorganic light-emitting diode may be aligned between two opposite electrodes having different polarities when an electric field is formed therebetween in a certain direction. The light-emitting element 300 may be aligned between the two opposite electrodes by the electric field formed between the two opposite electrodes.

The light-emitting element 300 may be in a form extending in one direction. The light-emitting element 300 may be in the form of a rod, wire, a tube, or the like. In an embodiment, the light-emitting element 300 may have a cylindrical or a rod shape. However, the light-emitting element 300 according to the invention is not limited thereto, and may have various shapes, e.g., a polyprism shape, such as a cube, a rectangular parallelepiped, or a hexagonal prism, or a shape which extends in one direction and the outer side of which is partially inclined in another embodiment. The plurality of semiconductors included in the light-emitting element 300 to be described below may be sequentially arranged or stacked in the direction.

The light-emitting element 300 may include semiconductor crystals doped with impurities of a conductive type (e.g., a p-type or n-type). The semiconductor crystals may receive an electrical signal supplied from an external power source and emit light of a specific wavelength band.

FIG. 9 is a schematic diagram of a light-emitting element according to an embodiment.

A light-emitting element 300 according to an embodiment may emit light of a specific wavelength band. In an embodiment, light emitted from an active layer 330 may be blue light with a central wavelength band of 450 nanometers (nm) to 495 nm. However, it should be understood that the central wavelength band of the blue light according to the invention is not limited thereto and includes all ranges of wavelengths of blue light in the art in another embodiment. The light emitted from the active layer 330 of the light-emitting element 300 according to the invention is not limited thereto, and may be green light of a central wavelength band of 495 nm to 570 nm or red light of a central wavelength band of 620 nm to 750 nm in another embodiment.

Referring to FIG. 9, the light-emitting element 300 according to an embodiment may include the first semiconductor layer 310, the second semiconductor layer 320, the active layer 330, and an insulating film 380. The light-emitting element 300 according to an embodiment may further include at least one electrode layer 370. FIG. 9 illustrates that the light-emitting element 300 includes one electrode layer 370 but embodiments according to the invention are not limited thereto. In some cases, the light-emitting element 300 may include more than one electrode layer 370 or the electrode layer 370 may be omitted. A description of the light-emitting element 300 below may equally apply even when the number of electrode layers 370 is changed or when the light-emitting element 300 further includes another structure.

The first semiconductor layer 310 may be a semiconductor layer of a first conductivity type, e.g., an n type semiconductor. For example, when the light-emitting element 300 emits light of a blue wavelength band, the first semiconductor layer 310 may include a semiconductor material having a chemical formula of $Al_xGa_yIn_{1-x-y}N$ ($0 \le x \le 1$, $0 \le y \le 1$, $0 \le x+y \le 1$). For example, the first semiconductor layer 310 may include at least one of AlGaInN, GaN, AlGaN, InGaN, AlN, and InN, which is doped with an n type dopant. The first semiconductor layer 310 may be doped with a first conductive type dopant, and the first conductivity type dopant may be, for example, Si, Ge, Sn or the like. In an embodiment, the first semiconductor layer 310 may be N—GaN doped with N-type silicon (Si). A length of the first semiconductor layer 310 may be in a range of 1.5 micrometers (μm) to 5 μm but embodiments according to the invention are not limited thereto.

The second semiconductor layer 320 is disposed on the active layer 330 to be described below. The second semiconductor layer 320 may be, for example, a p type semiconductor of a second conductivity type and may include a semiconductor material having a chemical formula of $Al_xGa_yIn_{1-x-y}N$ ($0 \le x \le 1$, $0 \le y \le 1$, $0 \le x+y \le 1$) when the light-emitting element 300 emits, for example, light of a blue or green wavelength band. For example, the second semiconductor layer 320 may include at least one of AlGaInN, GaN, AlGaN, InGaN, AlN, and InN, which is doped with a p type dopant. The second semiconductor layer 320 may be doped with a second conductive type dopant, and the second conductivity type dopant may be, for example, Mg, Zn, Ca, Se, Ba or the like. In an embodiment, the second semiconductor layer 320 may be P—GaN doped with p-type magnesium (Mg). A length of the second semiconductor layer 320 may be in a range of 0.05 μm to 0.10 μm but embodiments according to the invention are not limited thereto.

In the drawings, the first semiconductor layer 310 and the second semiconductor layer 320 are formed in one layer, but embodiments according to the invention are not limited thereto. In some cases, the first semiconductor layer 310 and the second semiconductor layer 320 may further include additional layers, e.g., a clad layer or a tensile strain barrier reducing ("TSBR") layer, according to the material of the active layer 330.

The active layer 330 is disposed between the first semiconductor layer 310 and the second semiconductor layer 320. The active layer 330 may include a material of a single or multi-quantum well structure. When the active layer 330 includes the material of the multi-quantum well structure, the active layer 330 may have a structure in which a quantum layer and a well layer are alternately stacked a plurality of times. The active layer 330 may emit light as electron-hole pairs are combined together according to an electrical signal applied through the first semiconductor layer 310 and the second semiconductor layer 320. For example, when the active layer 330 emits light of the blue wavelength band, the active layer 330 may include a material such as AlGaN, AlGaInN or the like. Particularly, when the active layer 330 has the multi-quantum well structure in which the quantum layer and the well layer are alternately stacked, the quantum layer may include a material such as AlGaN or AlGaInN, and the well layer may include a material such as GaN or AlInN. In an embodiment, the active layer 330 may include AlGaInN as the quantum layer and AlInN as the well layer, and the active layer 330 may emit blue light having a central wavelength band of 450 nm to 495 nm as described above.

However, embodiments according to the invention are not limited thereto, and the active layer 330 may have a structure in which a semiconductor material having high band gap energy and semiconductor materials having low band gap energy are alternately stacked, and may include Group III to V semiconductor materials according to a wavelength band of light emitted from the active layer 330 in another embodiment. The light emitted from the active layer 330 is not limited to light of the blue wavelength band, and in some cases, light of a red or green wavelength band may be emitted. A length of the active layer 330 may be in a range of 0.05 μm to 0.10 μm but embodiments according to the invention are not limited thereto.

Light may be emitted from the active layer 330 to opposite sides of the light-emitting element 300, as well as an outer surface thereof in a longitudinal direction. Directionality of the light emitted from the active layer 330 according to the invention is not limited to one direction.

The electrode layer 370 may be an ohmic contact electrode. However, the electrode layer 370 according to the invention is not limited thereto and may be a Schottky contact electrode. The electrode layer 370 may include a conductive metal. For example, the electrode layer 370 may include at least one of aluminum (Al), titanium (Ti), indium (In), gold (Au), silver (Ag), indium tin oxide (ITO), indium zinc oxide (IZO), and indium tin-zinc oxide (ITZO). The electrode layer 370 may further include a semiconductor material doped with an n or p type.

The insulating film 380 is disposed to surround outer surfaces of the plurality of semiconductors described above. In an embodiment, the insulating film 380 may be disposed to surround at least an outer surface of the active layer 330 and may extend in a direction in which the light-emitting element 300 extends. The insulating film 380 may protect the above-described members. For example, the insulating film 380 may surround sides of the members and expose the opposite ends of the light-emitting element 300 in the longitudinal direction.

In the drawings, it is illustrated that the insulating film 380 extends in the longitudinal direction of the light-emitting element 300 to cover ranging from the first semiconductor layer 310 to the electrode layer 370, but embodiments according to the invention are not limited thereto. The insulating film 380 may cover only the outer surfaces of some conductive type semiconductors, including the active layer 330, or cover only a part of the outer surface of the electrode layer 370 to partially expose the outer surface of the electrode layer 370 in another embodiment. Alternatively, an upper surface of a cross section of a region of the insulating film 380 adjacent to at least one end of the light-emitting element 300 may have a round shape.

A thickness of the insulating film 380 may be in a range of 10 nm to 1.0 μm but embodiments according to the invention are not limited thereto. Preferably, the thickness of the insulating film 380 may be about 40 nm.

The insulating film 380 may include materials having an insulating property, for example, silicon oxide (SiOx), silicon nitride (SiOx), silicon oxynitride (SiOxNy), aluminum nitride (AlN), aluminum oxide ($Al_2O_3$), or the like. Accordingly, it is possible to prevent an electrical short circuit that may occur when the active layer 330 is in direct contact with an electrode that transmits an electrical signal to the light-emitting element 300. Furthermore, because the insulating film 380 protects the outer surface of the light-emitting element 300, including the active layer 330, it is possible to prevent a reduction in luminous efficiency.

In some embodiments, the outer surface of the insulating film 380 may be surface-treated. The light-emitting element 300 may be sprayed and aligned onto the electrode during the manufacture of the display device 10 in a state in which the light-emitting element 300 is dispersed in a certain ink. Here, a surface of the insulating film 380 may be hydrophobically or hydrophilically treated so that in the ink, the light-emitting element 300 may be maintained in a dispersed state without being united with other light-emitting elements 300.

A length of the light-emitting element 300 may be in a range of 1 μm to 10 μm or a range of 2 μm to 6 μm, and preferably, a range of 3 μm to 5 μm. A diameter of the light-emitting element 300 be in a range of 300 nm to 700 nm, and an aspect ratio of the light-emitting element 300 may be in a range of 1.2 to 100. However, embodiments according to the invention are not limited thereto, and a plurality of light-emitting elements 300 included in the display device 10 may have different diameters according to the difference between composition rates of the active layer 330. Preferably, the diameter of the light-emitting element 300 may be about 500 nm.

A manufacturing method of a display device 10 according to an embodiment will be described below.

Figure 10:
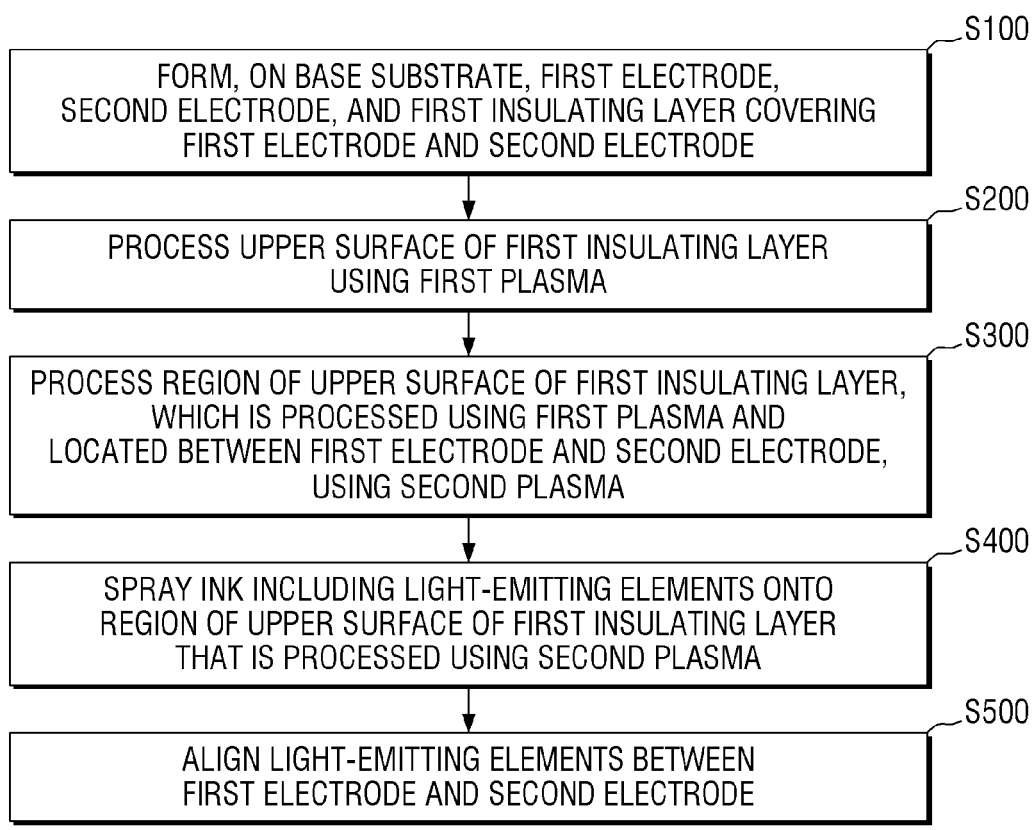
FIG. 10 is a flowchart of a manufacturing method of a display device according to an embodiment.

FIG. 10 is a flowchart of a manufacturing method of a display device according to an embodiment.

According to an embodiment, in the manufacturing process of the display device 10, the first portion 511 and the second portion 512 of the first insulating layer 510 may be formed through a plasma process. The first portion 511 and the second portion 512 of the first insulating layer 510 may be formed by forming a material of the second sub-insulating layer 513 and processing an upper surface of the second sub-insulating layer 513 using a first or second plasma. The first plasma and the second plasma may be selectively emitted to some regions of each pixel PX or sub-pixel PXn to form the first and second portions 511 and 512 in the regions.

After the first insulating layer 510 according to an embodiment is formed by the above process, the light-emitting elements 300 may be disposed in the first region IR1 in which the first portion 511 is provided, thereby manufacturing the display device 10. For a more detailed description, other drawings will be referred to. In the following description, only the first electrode 210, the second electrode 220, and the first insulating layer 510, except for the banks 410 and 420 disposed on the circuit element layer PAL, will be shown to describe the manufacturing process of the display device 10. However, it will be obvious that the following description may also apply to a case in which the first bank 410 and the second bank 420 are disposed on the circuit element layer PAL.

FIGS. 11 to 18 are schematic diagrams illustrating a manufacturing process of a display device according to an embodiment.

Figure 11:
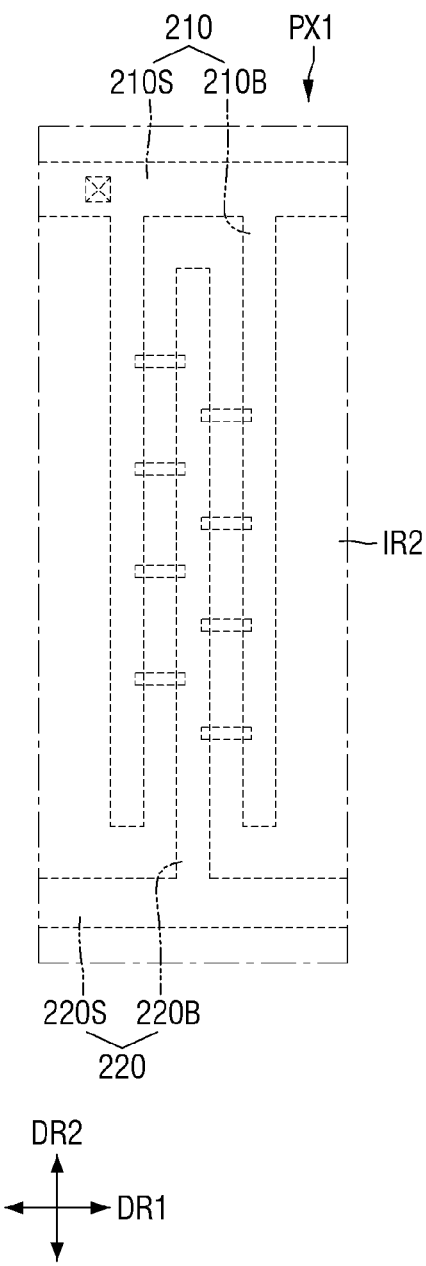
FIGS. 11 to 18 are schematic diagrams illustrating a manufacturing process of a display device according to an embodiment.
Figure 12:
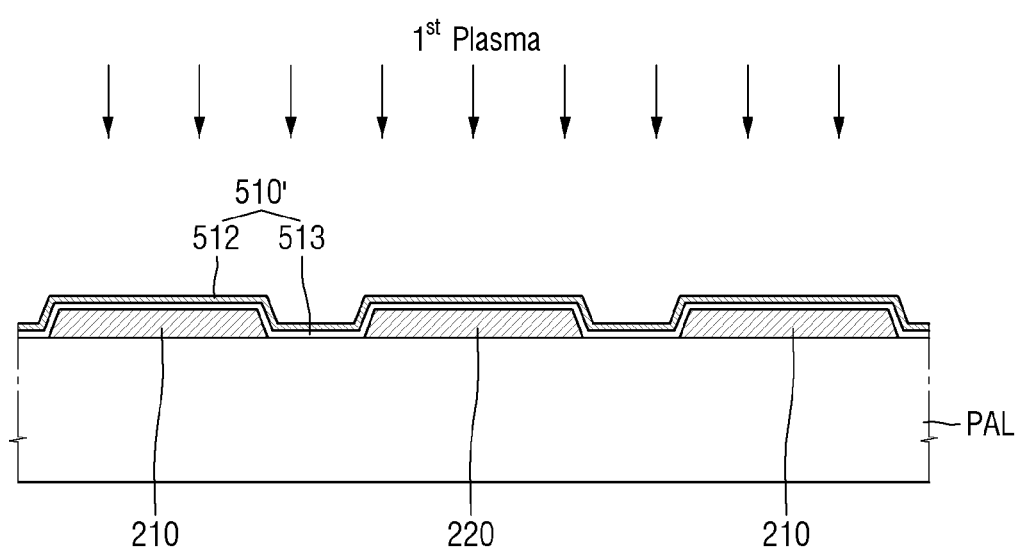

First, as shown in FIGS. 11 and 12, a first electrode 210, a second electrode 220, and a second sub-insulating layer 513 covering the first and second electrodes 210 and 220 may be formed on a circuit element layer PAL (S100), and an upper surface of the second sub-insulating layer 513 may be processed by a first plasma (S200), thereby forming a first insulating layer 510'. The first insulating layer 510' may include a second portion 512 and a second sub-insulating layer 513. A first portion 511 of the first insulating layer 510' may be further formed in a subsequent process, thereby obtaining a first insulating layer 510. The first insulating layer 510' may be formed by forming the second sub-insulating layer 513 covering the first electrode 210 and the second electrode 220 and forming a second portion 512 on an upper surface of the second sub-insulating layer 513. In an embodiment, the second portion 512 may be formed by emitting the first plasma on the second sub-insulating layer 513.

As described above, when the first plasma is emitted to the second sub-insulating layer 513 including silicon oxycarbide (SiOCx), a silicon-carbon (Si—C) bond is broken and a new bond is formed with a gas contained in the first plasma. In an embodiment, the first plasma may be a fluorine-based plasma. Accordingly, the second portion 512 containing a silicon-fluoromethyl (Si-CnFm) bond may be provided on the second sub-insulating layer 513.

Figure 13:
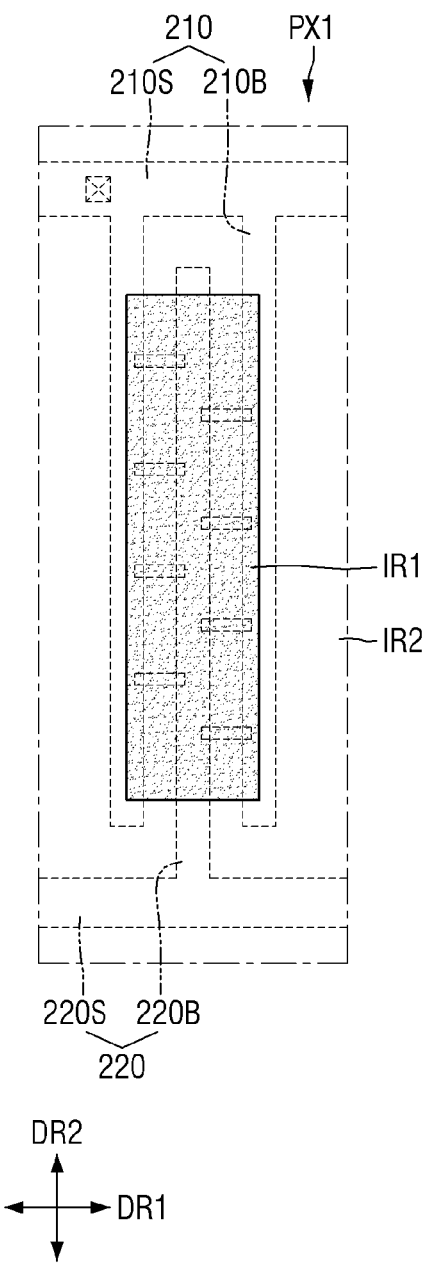
Figure 14:
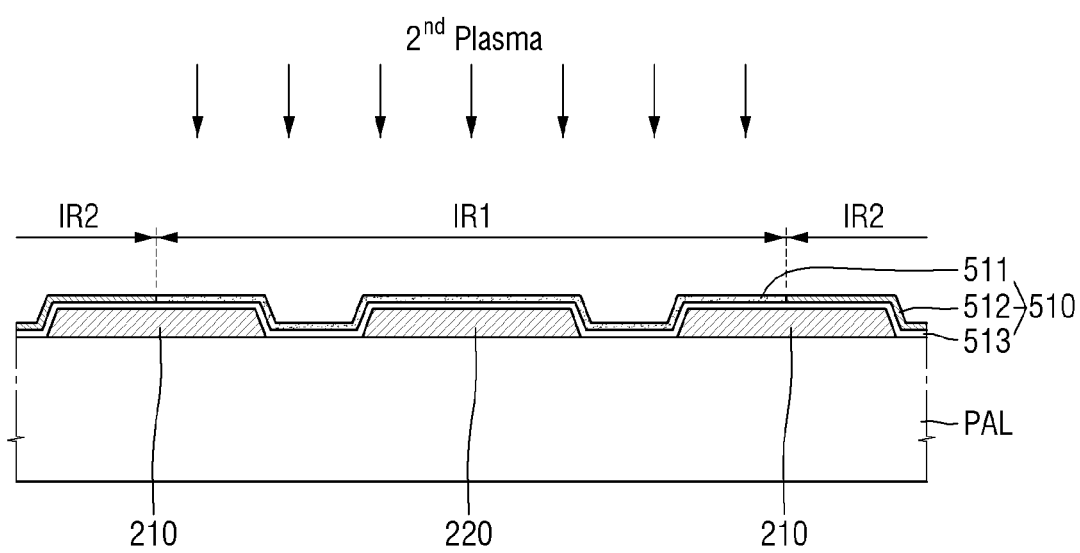

Next, referring to FIGS. 13 and 14, a first portion 511 is formed by emitting a second plasma to at least some regions of the first insulating layer 510' (S300). In an embodiment, the second plasma may be emitted to a region of an upper surface of the second portion 512, which is formed by emitting the first plasma between the first electrode 210 and the second electrode 220. In the region of the upper surface of the second portion 512 to which the second plasma is emitted, the silicon-fluoromethyl (Si-CnFm) bond may be broken and a new bond may be formed with the gas contained in the second plasma. In an embodiment, the second plasma may be an oxygen-based plasma. Accordingly, a first portion 511 containing a silicon-oxygen (Si—O) bond may be formed on the second sub-insulating layer 513. The region of the second sub-insulating layer 513 on which the first portion 511 is formed may form the first region IR1, and the region thereof on which the second portion 512 is formed may form the second region IR2. This has been described above.

However, embodiments according to the invention are not limited thereto. In some cases, the first portion 511, the second portion 512, and the second sub-insulating layer 513 may be formed by emitting the first plasma and the second plasma (see FIG. 13) on the upper surface of the first insulating layer 510, respectively, without forming the first insulating layer 510'. As will be described below with reference to other drawings, the first plasma and the second plasma may be emitted onto the upper surface of a certain region but may be selectively emitted only to some areas in some cases. Although not shown in the drawings, in some embodiments, a layer including the material of the first insulating layer 510 may be formed, the first portion 511 may be formed by emitting the second plasma to a position corresponding to the first region IR1, and the second portion 512 may be formed by emitting the first plasma to a position corresponding to the second region IR2.

Figure 15:
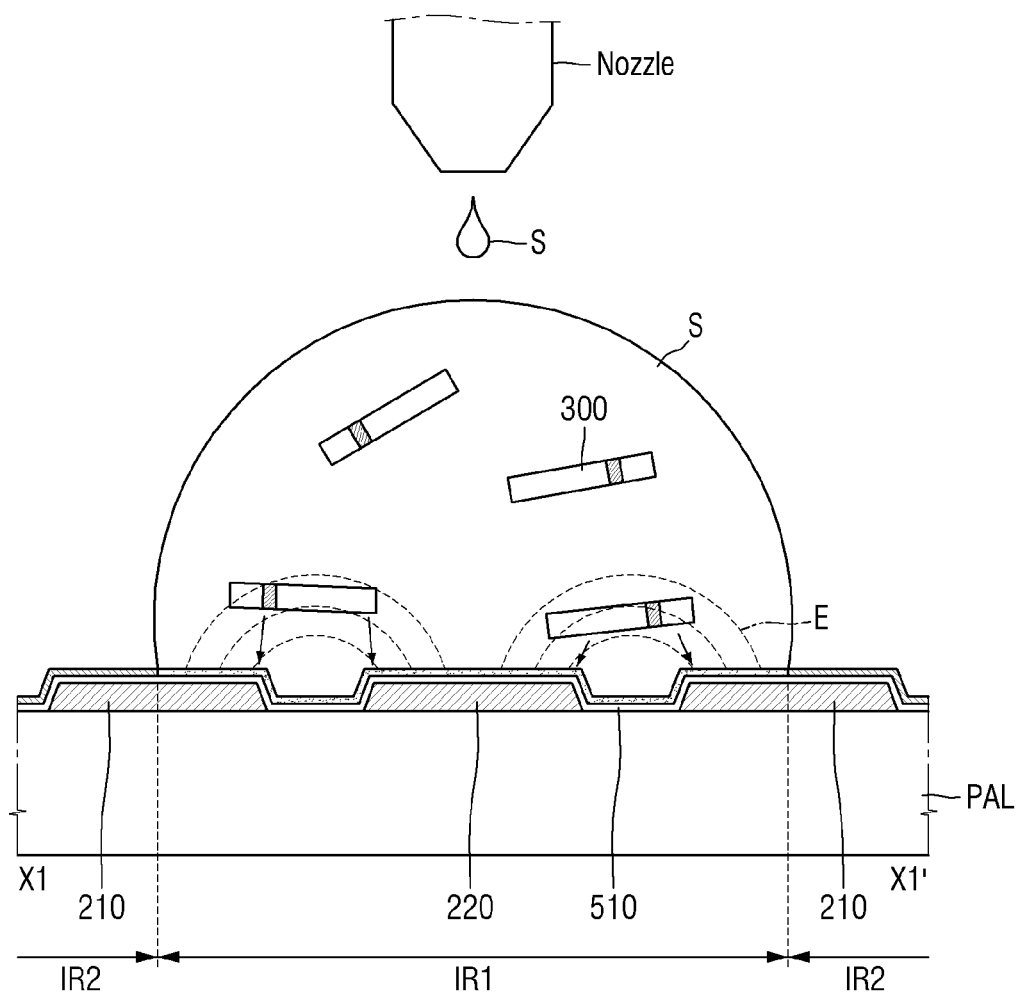

Next, referring to FIG. 15, ink S including light-emitting elements 300 is sprayed onto the region processed by the second plasma, i.e., the first portion 511 (S400). In an embodiment, the ink S including the light-emitting elements 300 may be sprayed through a nozzle by an inkjet method. However, embodiments according to the invention are not limited thereto.

The ink S may include a solvent and the light-emitting elements 300 dispersed in the solvent. In an embodiment, the ink S may be provided in a solution or a colloid state. For example, the solvent may be, but is not limited to, acetone, water, alcohol, toluene, propylene glycol ("PG") or propylene glycol methyl acetate ("PGMA"), etc.

As described above, the ink S may be induced to be positioned on the first portion 511 in the first region IR1, and most of the light-emitting elements 300 may be positioned on the first region IR1, i.e., between the first electrode 210 and the second electrode 220. The ink S may be located only on the first region IR1 and may not move to the second region IR2, and the number of light-emitting elements 300 disposed between the first and second electrodes 210 and 220 may be increased and the number of light-emitting elements 300 that may be lost or remain defective in the manufacturing process of the display device 10 may be reduced. Even when structures are omitted at a boundary of neighboring sub-pixels PXn, the ink S may be prevented from flowing to other sub-pixels PXn.

Next, the light-emitting elements 300 are aligned between the first electrode 210 and the second electrode 220 (S500). The aligning of the light-emitting elements 300 (S500) may include supplying an electric signal to the first electrode 210 and the second electrode 220 to form an electric field in the ink S, receiving a dielectrophoretic force through the electric field to dispose the light-emitting elements 300 on the electrodes 210 and 220, and removing the solvent from the ink S.

The light-emitting elements 300 may be disposed on the electrodes 210 and 220 by dielectrophoresis ("DEP"). When the solution in which the light-emitting elements 300 are dispersed is sprayed onto the electrodes 210 and 220 and alternating-current ("AC") power is supplied to the electrodes 210 and 220, an electric field may be formed between the first electrode 210 and the second electrode 220 and the dielectrophoretic force may be applied to the light-emitting elements 300 due to the electric field. A force moving or rotating in one direction may be applied to the light-emitting elements 300 receiving the dielectrophoretic force, and finally, the light-emitting elements 300 may be disposed between the first electrode 210 and the second electrode 220. The ink S may be induced to be positioned in the first region IR1, and a plurality of the light-emitting elements 300 may be disposed to be aligned in one direction between the first electrode 210 and the second electrode 220.

Figure 16:
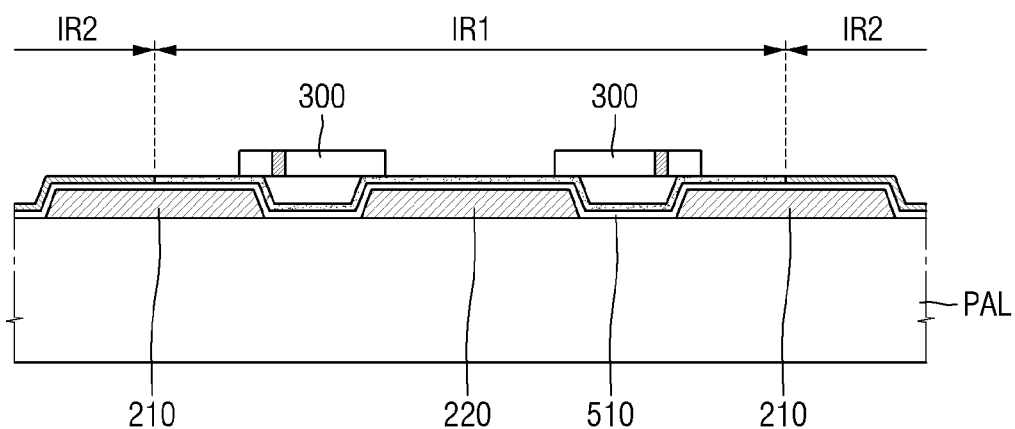

Next, as shown in FIG. 16, when the light-emitting elements 300 are disposed on the electrodes 210 and 220, the solvent is removed from the ink S. A general method may be employed to remove the solvent. For example, the solvent may be removed by a method such as heat treatment or infrared irradiation. Thereafter, although not shown in the drawings, the display device 10 according to an embodiment may be manufactured by performing a process of forming a plurality of members to be included in the display device 10, e.g., a contact electrode 260, a second insulating layer 520, a passivation layer 550, etc. This will be described in detail below.

The display device 10 according to an embodiment may include a plurality of sub-pixels PXn, and the manufacturing process of the display device 10 may be performed by sequentially processing the sub-pixels PNx by the second plasma to dispose the light-emitting elements 300. Here, in a region to which the second plasma is not emitted the second plasma may be blocked by a mask. In an embodiment, generally, the mask may be a mask that does not react with a plasma, and for example, a metal mask, a photoresist ("PR") or the like may be employed. However, embodiments according to the invention are not limited thereto.

Figure 17:
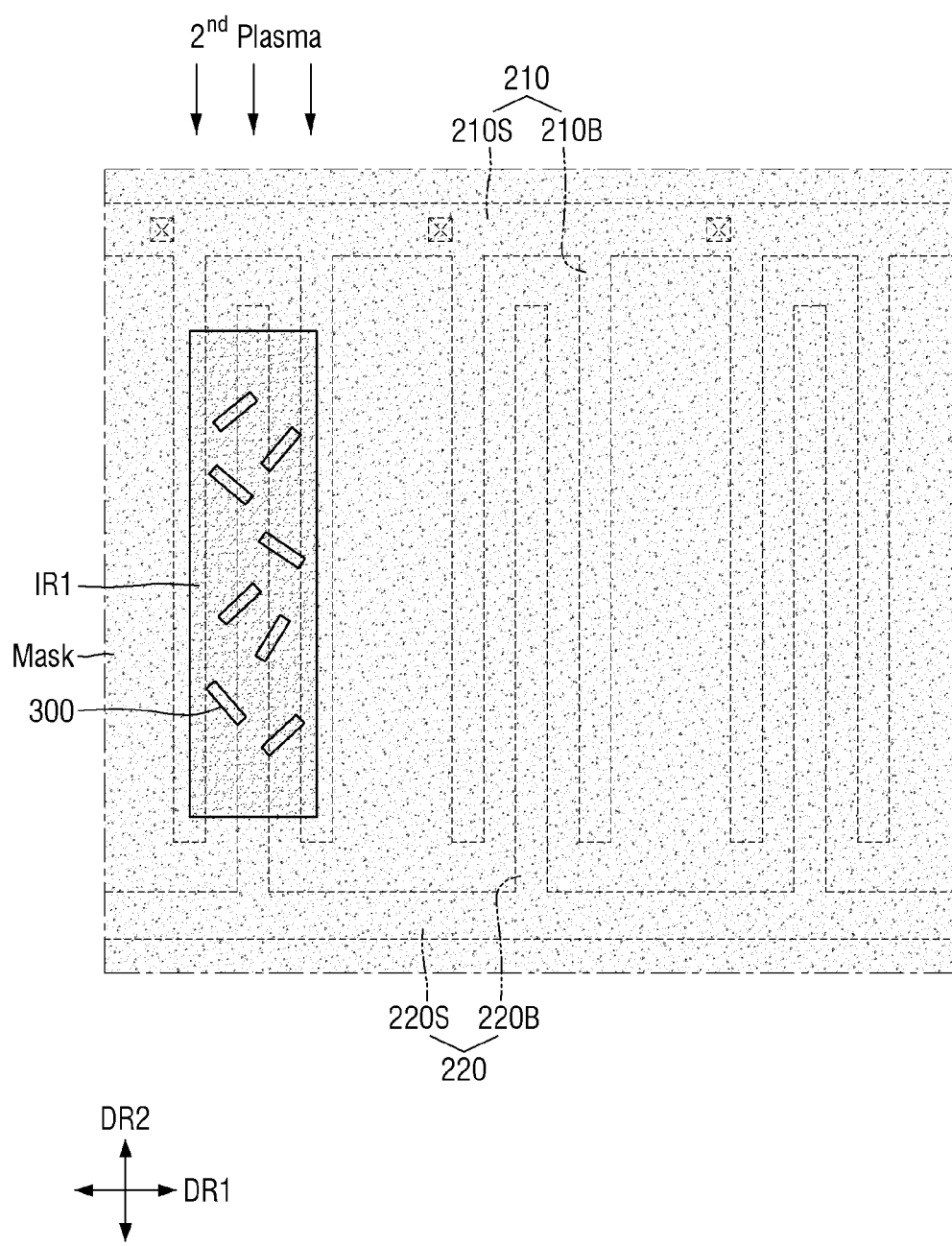
Figure 18:
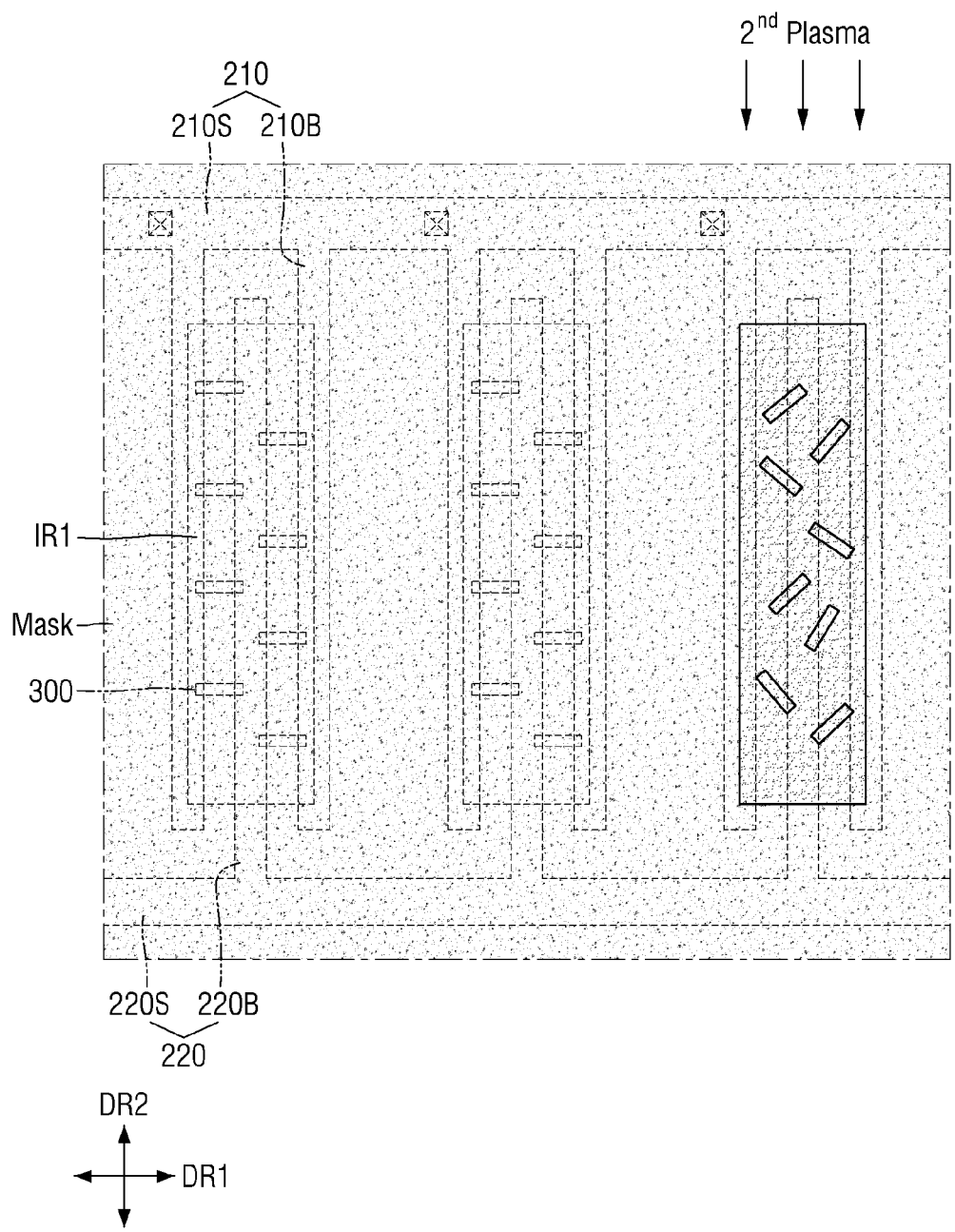

Referring to FIGS. 17 and 18, according to an embodiment, in the emitting of the second plasma to form the first portion 511, the mask may be disposed on a region of the first sub-pixel PX1 except for some regions and the second plasma may be emitted only to the first sub-pixel PX1. Accordingly, the first region IR1 may be formed only between the first electrode 210 and the second electrode 220 disposed in the first sub-pixel PX1, and the light-emitting elements 300 sprayed onto the sub-pixels PXn may be located only between the first electrode 210 and the second electrode 220 on the first sub-pixel PX1. In the emitting of the second plasma, because the first portion 511 is not formed in the other sub-pixels PXn on which the mask is disposed, the light-emitting elements 300 may be aligned only in the first sub-pixel PX1.

Next, as shown in FIG. 18, when the mask is disposed on the first sub-pixel PX1 and the second sub-pixel PX2 in which the light-emitting elements 300 are aligned, the second plasma may be emitted only to a third sub-pixel PX3. Thereafter, the light-emitting elements 300 may be aligned on the third sub-pixel PX3 in the same manner. However, embodiments according to the invention are not limited thereto, and the first plasma and the second plasma may be selectively emitted to some regions as described above. That is, the first region IR1 and the second region IR2 of the first sub-pixel PX1, the second sub-pixel PX2, and the third sub-pixel PX3 may be formed by emitting the first plasma and the second plasma to some regions in one process. In this case, the light-emitting elements 300 disposed in each sub-pixel PXn may not be sequentially disposed but may be simultaneously disposed in the same process.

The method of manufacturing the display device 10 according to an embodiment includes forming the first portion 511 and the second portion 512 having different polarities by emitting a plasma on the second sub-insulating layer 513, and the ink S sprayed onto each sub-pixel PXn may be induced to be positioned in the first region IR1. Accordingly, the number of light-emitting elements 300 disposed between the first electrode 210 and the second electrode 220 may be increased and the number of light-emitting elements 300 that will be lost or remain defective in the manufacturing process of the display device 10 may be reduced. Furthermore, even when a structure at a boundary between neighboring sub-pixels PXn is omitted, the ink S may be prevented from flowing to other sub-pixels PXn.

Various embodiments of the display device 10 will be described further with reference to other drawings below.

Figure 19:
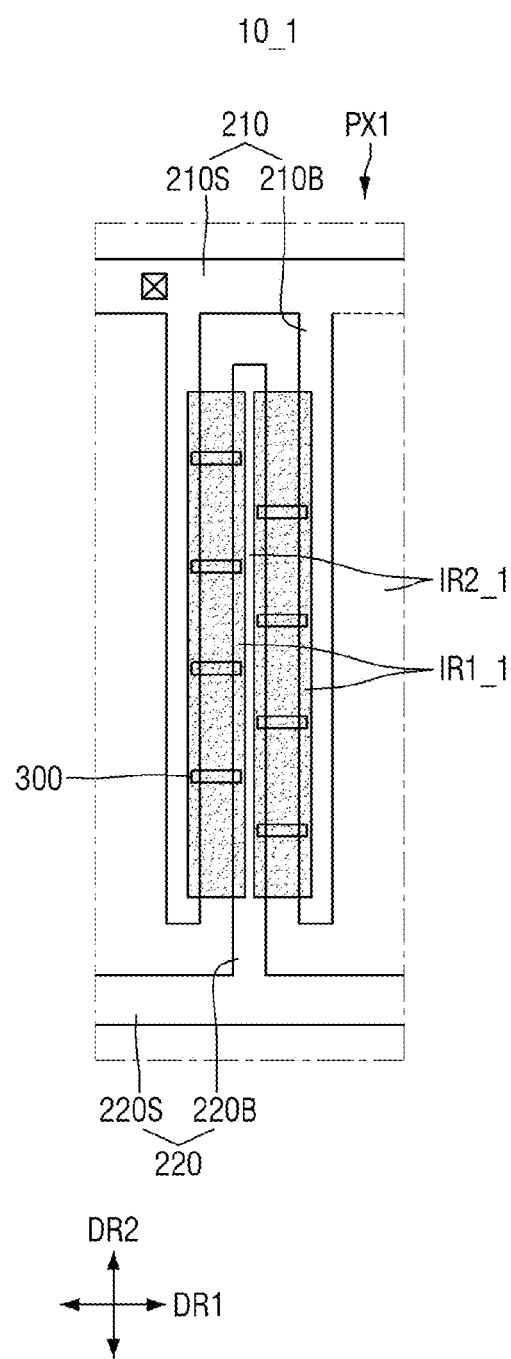
FIGS. 19 and 20 are plan views illustrating sub-pixels of display devices according to other embodiments.
Figure 20:
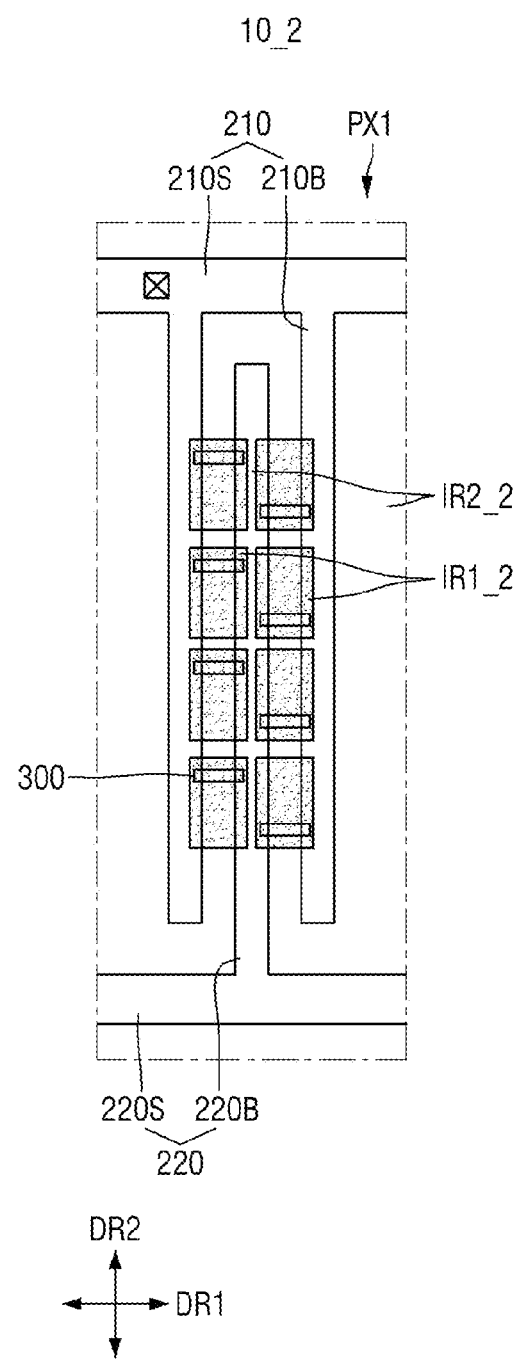

FIGS. 19 and 20 are plan views illustrating sub-pixels of display devices according to other embodiments.

A first region IR1 according to an embodiment may not necessarily be limited to the shape shown in FIG. 2. In some cases, the first region IR1 may be provided by forming a plurality of patterns in one sub-pixel PXn.

Referring to FIGS. 19 and 20, in display devices 10_1 and 10_2 according to embodiments, a plurality of first regions IR1_1 or IR1_2 may be disposed in one sub-pixel PXn to be spaced apart from each other. The plurality of first regions IR1_1 or IR1_2 illustrated in FIGS. 19 and 20 may be understood as regions in which the first portion 511 of the first insulating layer 510 is substantially formed. The display devices 10_1 and 10_2 of FIGS. 19 and 20 are the same as the display device 10 of FIG. 2 except that the plurality of first regions IR1_1 and IR1_2 are spaced apart from each other. A form in which the first regions IR1_1 and IR1_2 are disposed will now be described in detail and parts that are the same as those described above will be omitted.

First, in the display device 10_1 of FIG. 19, two first regions IR1_1 extending in one direction, i.e., a second direction DR2, may be disposed to be spaced apart from each other in one sub-pixel PXn. The plurality of first regions IR1_1 may be disposed between one first electrode branch portion 210B and a second electrode branch portion 220B or between the second electrode branch portion 220B and another first electrode branch portion 210B. Each of the plurality of first regions IR1_1 may be in a form extending in the second direction DR2, along the first electrode branch portion 210B and the second electrode branch portion 220B. The plurality of first regions IR1_1 may be spaced apart from each other in the first direction DR1 on the second electrode branch portion 220B.

Next, in the display device 10_2 of FIG. 20, a plurality of first regions IR1_2 may be disposed in one sub-pixel PXn to be spaced apart from each other in the first direction DR1 and the second direction DR2. The display device 10_2 of FIG. 20 is the same as the display device 10_1 of FIG. 19 except that more than two first regions IR1_2 are disposed in each sub-pixel PXn to be spaced apart from each other in the first direction DR1 and the second direction DR2.

As described above, the first regions IR1_1 and IR1_2 of the display devices 10_1 and 10_2 may be regions in which the first portion 511 of the first insulating layer 510 is formed, and the first portion 511 may be formed by emitting the second plasma. In the emitting of the second plasma, the second plasma may be partially emitted to each sub-pixel PXn by placing a mask thereon. According to an embodiment, the first portion 511 may be partially formed in one sub-pixel PXn by partially emitting the second plasma. Accordingly, light-emitting elements 300 may be intensively disposed in a specific region of each sub-pixel PXn.

Figure 21:
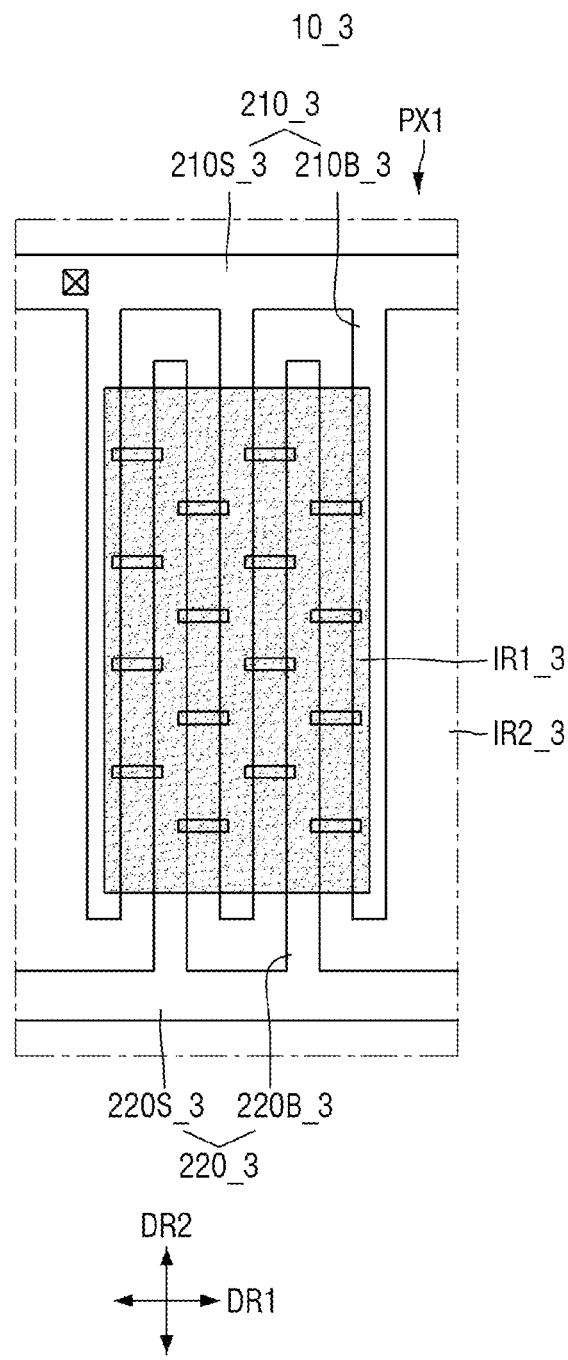
FIG. 21 is a plan view of a sub-pixel of a display device according to another embodiment.
Figure 22:
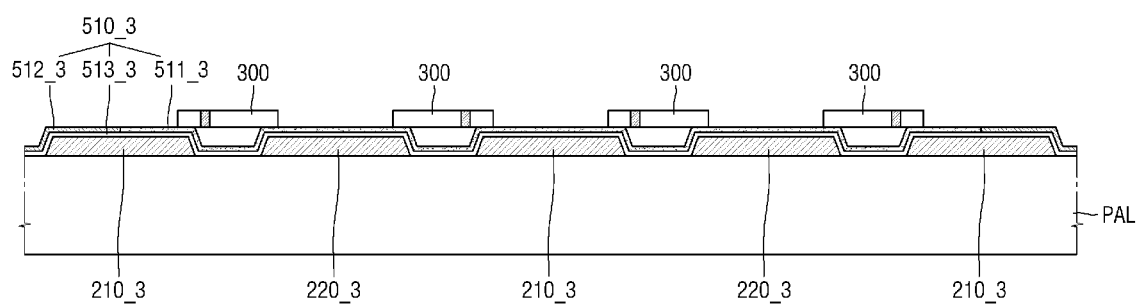
FIG. 22 is a cross-sectional view schematically illustrating a cross section of a sub-pixel of the display device of FIG. 21.

FIG. 21 is a plan view of a sub-pixel of a display device according to another embodiment. FIG. 22 is a cross-sectional view schematically illustrating a cross section of a sub-pixel of the display device of FIG. 21.

Referring to FIGS. 21 and 22, a display device 10_3 according to an embodiment may include larger numbers of first electrode branch portions 210B_3 and second electrode branch portions 220B_3 than the numbers of the first electrode branch portions 210B and second electrode branch portions 220B in FIG. 2. FIGS. 21 and 22 illustrate that a first electrode 210_3 includes three first electrode branch portions 210B_3 and a second electrode 220_3 includes two second electrode branch portions 220B_3. The display device 10_3 of FIGS. 21 and 22 is the same as the display device 10 of FIG. 2 except that larger numbers of electrode branch portions 210B_3 and 220B_3 are provided. Hereinafter, redundant description will be omitted and differences will be described.

The display device 10_3 of FIGS. 21 and 22 includes a plurality of first electrode branch portions 210B_3 and a plurality of second electrode branch portions 220B_3 and thus a region of one sub-pixel PXn in which light-emitting elements 300 may be disposed may increase. Accordingly, more light-emitting elements 300 may be disposed in one sub-pixel PXn and the amount of light emitted from each sub-pixel PXn may be increased compared to the embodiment in FIG. 2. In addition, the area where the first portion 511_3 of each sub-pixel PXn is formed can also be increased. Unlike the display device 10 of FIG. 2, in the display device 10_3 of FIGS. 21 and 22, the first portion 511_3 may be provided to overlap opposite sides of a certain first electrode branch portions 210B_3 which faces second electrode branch portions 220B_3 in its opposite sides (e.g., the center first electrode branch portions 210B_3 of the three first electrode branch portions 210B_3).

Figure 23:
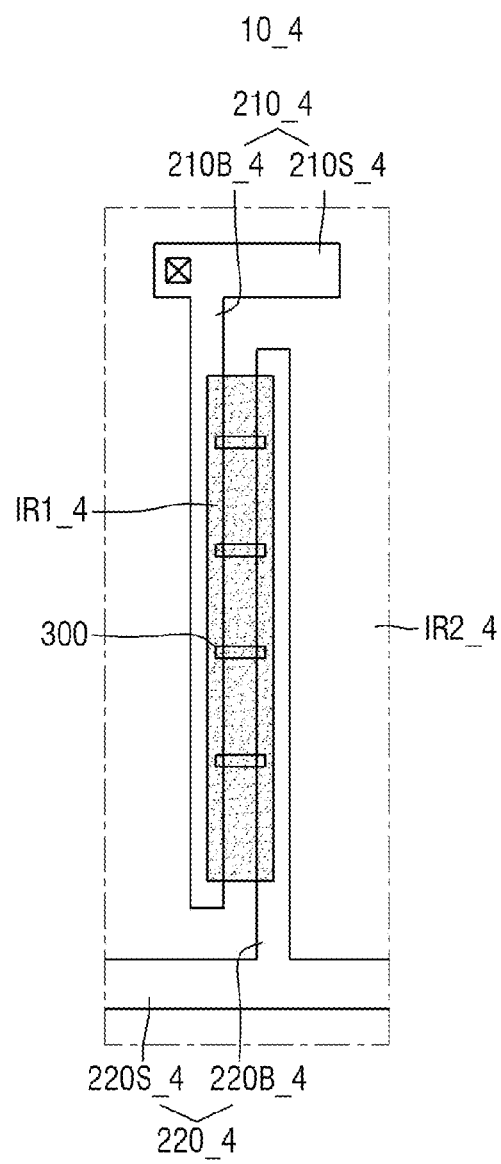
FIG. 23 is a plan view of a sub-pixel of a display device according to another embodiment.
Figure 24:
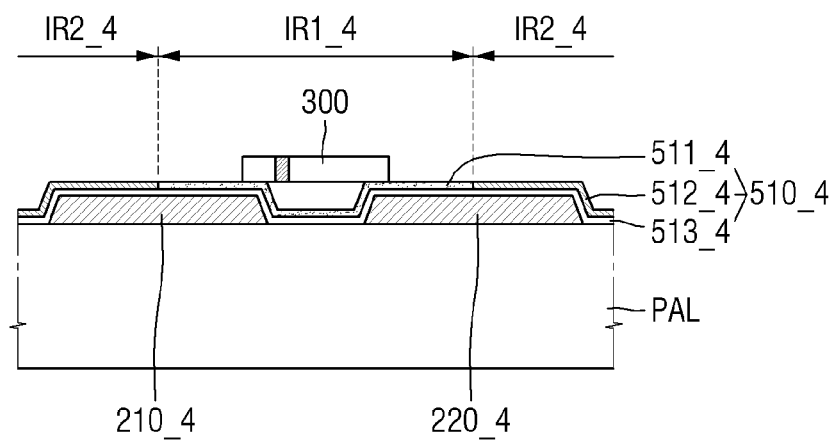
FIG. 24 is a cross-sectional view schematically illustrating a cross section of a sub-pixel of the display device of FIG. 23.

FIG. 23 is a plan view of a sub-pixel of a display device according to another embodiment. FIG. 24 is a cross-sectional view schematically illustrating a cross section of a sub-pixel of the display device of FIG. 23.

Referring to FIGS. 23 and 24, a display device 10_4 according to an embodiment may include a smaller number of first electrode branch portions 210B_4. In FIGS. 23 and 24, the first electrode 210_4 includes one first electrode branch portion 210B_4, and the second electrode 220_4 includes one second electrode branch portion 220B_4. The display device 10_4 of FIGS. 23 and 24 is the same as the display device 10 of FIG. 2 except that a smaller number of electrode branch portions 210B_4 and 220B_4 are provided. Hereinafter, redundant description will be omitted and differences will be described.

The display device 10_4 of FIGS. 23 and 24 may include only one first electrode branch portion 210B_4 and one second electrode branch portion 220B_4. In this case, a first portion 511_4 may be disposed to overlap only one side of the first electrode branch portion 210B_4 and one side of the second electrode branch portion 220B_4 facing each other. Furthermore, the display device 10_4 may include only one first electrode branch portion 210B_4 and one second electrode branch portion 220B_4, thereby reducing the size of each sub-pixel PXn. Because a first region IR1_4 may be formed for each sub-pixel PXn to dispose light-emitting elements 300 at a high density in a certain region, a desired number of light-emitting elements 300 may be disposed even when the size of one sub-pixel PXn is reduced. In addition, as the size of one sub-pixel PXn is reduced, a size of one pixel PX including three sub-pixels PXn may decrease. In this case, a second region IR2_4 at a boundary between neighboring sub-pixels PXn may effectively prevent ink S from flowing to other sub-pixels PXn when light-emitting elements 300 are aligned in one sub-pixel PXn.

In an embodiment, each sub-pixel PXn may include different types of light-emitting elements 300 to emit light of different wavelength bands.

Figure 25:
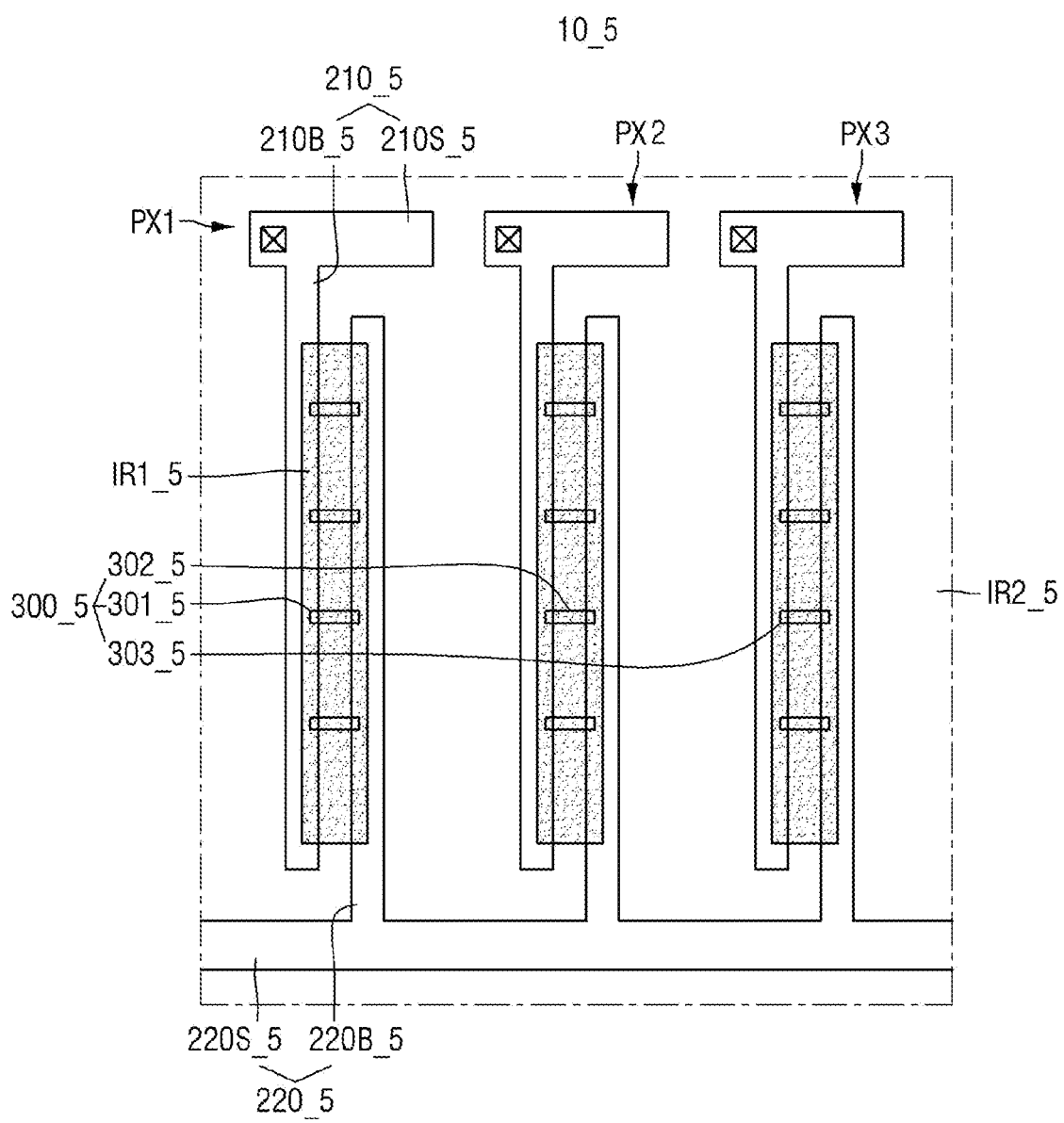
FIG. 25 is a plan view illustrating three sub-pixels of the display device of FIG. 23.
Figure 26:
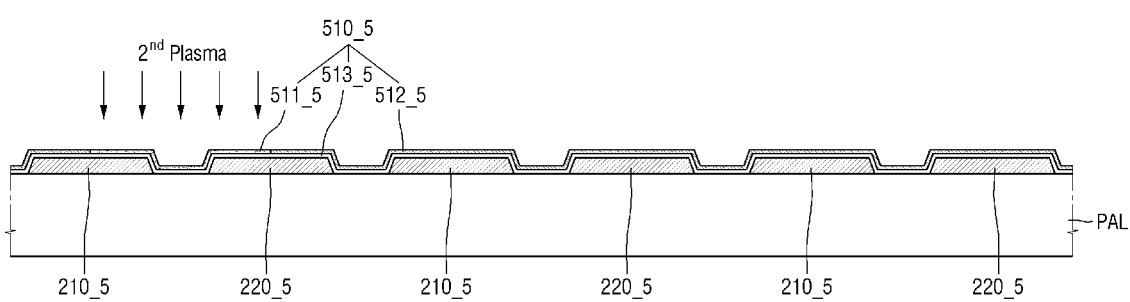
FIGS. 26 to 28 are schematic cross-sectional views illustrating some operations of a manufacturing process of the display device of FIG. 25.
Figure 27:
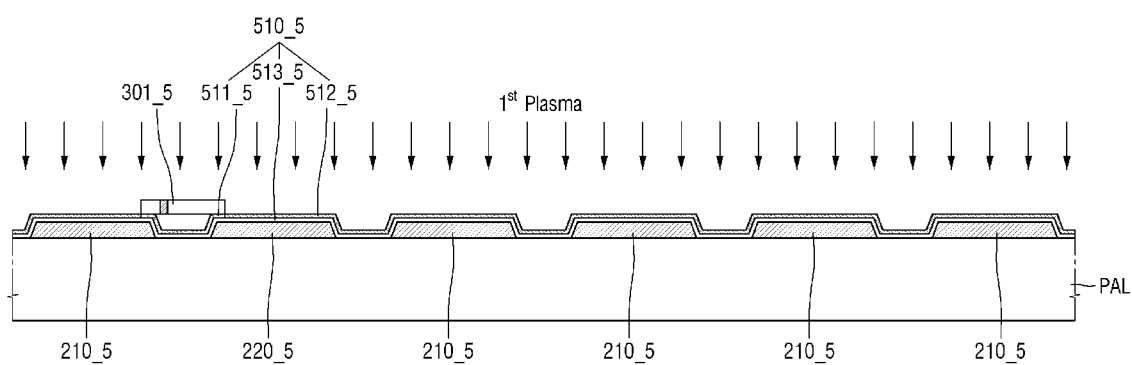
Figure 28:
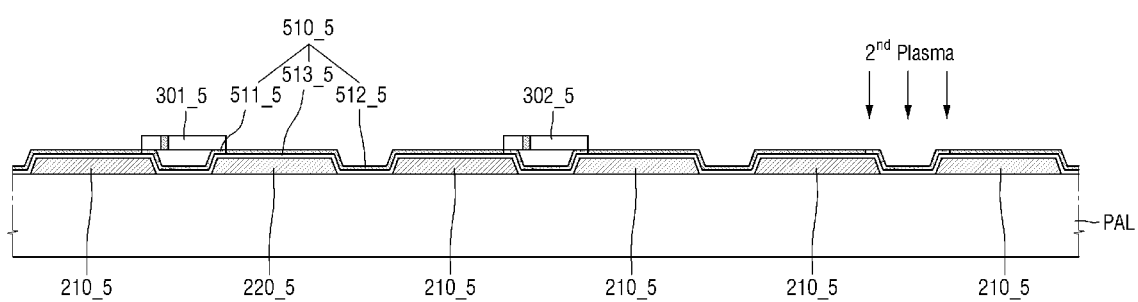

FIG. 25 is a plan view illustrating three sub-pixels of the display device of FIG. 23. FIGS. 26 to 28 are schematic cross-sectional views illustrating some operations of a manufacturing process of the display device of FIG. 25.

Referring to FIGS. 25 to 28, in a display device 10_5 according to an embodiment, a first sub-pixel PX1, a second sub-pixel PX2, and a third sub-pixel PX3 may include first light-emitting elements 301_5, second light-emitting elements 302_5, and third light-emitting elements 303_5, respectively, which are different from one another. As each sub-pixel PXn includes one first electrode branch portion 210B_5 and one second electrode branch portion 220B_5, a boundary between neighboring sub-pixels PXn may decrease significantly. Further, as each of the sub-pixels PXn includes different light emitting elements 300_5, it is important to prevent ink S sprayed onto electrodes from flowing to neighboring sub-pixels PXn during a manufacturing process of the display device 10_5. The display device 10_5 according to an embodiment includes a first region IR1_5 and a second region IR2_5 to effectively prevent ink S including light-emitting elements 300_5 from flowing to neighboring sub-pixels PXn when the ink S is sprayed.

As shown in FIGS. 26 to 28, a first insulating layer 510_5 may include silicon oxycarbide, and a first portion 511_5 and a second portion 512_5 may be formed by plasmas emitted to the first insulating layer 510_5. Particularly, even when the second plasma is emitted to the second portion 512_5, the first portion 511_5 may be formed. Accordingly, the first portion 511_5 may be formed by emitting the second plasma to a first sub-pixel PX1, the first light-emitting element 301_5 may be disposed, and the second portion 512_5 may be formed in a region, except for a region in which the first light-emitting element 301_5 overlaps the first light-emitting element 301_5, by emitting the second plasma (as shown in FIG. 27).

According to an embodiment, a first region IR1_5 may be selectively formed in a certain region by repeatedly performing a process of forming the first portion 511_5 by emitting the second plasma to the region and a process of forming the second portion 512_5 by emitting the first plasma to the region. The ink S in which the light-emitting elements 300_5 are dispersed may not flow to a second region IR2_5 except for the first region IR1_5 but may be positioned only on the first region IR1_5. Thus, when the different light-emitting elements 300_5 are disposed in a relatively narrow pixel PX or sub-pixel PXn, a light-emitting element 300_5, e.g., the first light-emitting element 301_5, may be prevented from being disposed in a second sub-pixel PX2 or a third sub-pixel PX3 other than the first sub-pixel PX1 even when a separate structure at a boundary between sub-pixels PXn is omitted.

A structure of the light-emitting element 300 according to the invention is not limited to that illustrated in FIG. 9, and the light-emitting element 300 may have a different structure.

Figure 29:
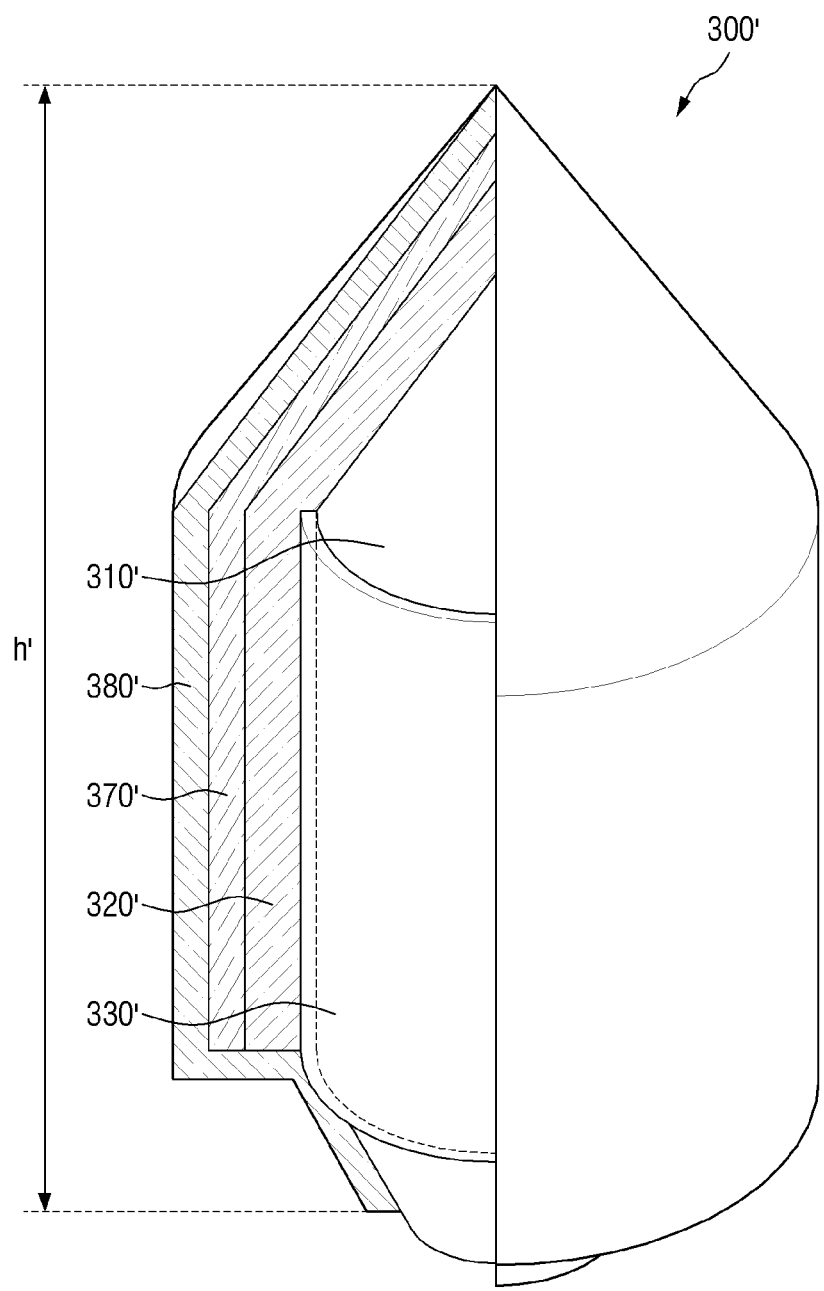
FIG. 29 is a schematic diagram of a light-emitting element according to another embodiment.

FIG. 29 is a schematic diagram of a light-emitting element according to another embodiment.

Referring to FIG. 29, a light-emitting element 300' may have a shape which extends in one direction and sides of which are partially inclined. That is, the light-emitting element 300' according to an embodiment may have a partially conical shape. The light-emitting element 300' may be formed such that a plurality of layers are not stacked in one direction but may each be formed to surround an outer surface of another layer. The light-emitting element 300' of FIG. 29 is the same as the light-emitting element 300 of FIG. 9 except that the shapes of the layers are slightly different. A description of parts that are the same as those of the light-emitting element 300 will be omitted and differences from the light-emitting element 300 will be described below.

According to an embodiment, a first semiconductor layer 310' may extend in one direction and opposite ends thereof may be inclined toward a center thereof. The first semiconductor layer 310' of FIG. 29 may include a main body having a rod or cylindrical shape and upper and lower ends each having a conical shape. A degree of inclination of the upper end of the main body may be higher than that of inclination of the lower end thereof.

An active layer 330' is disposed to surround an outer surface of the main body of the first semiconductor layer 310'. The active layer 330' may have a ring shape extending in one direction. The active layer 330' may not be formed on the upper end and the lower end of the first semiconductor layer 310'. That is, the active layer 330' may be in contact with only parallel sides of the first semiconductor layer 310'.

A second semiconductor layer 320' is disposed to surround an outer surface of the active layer 330' and the upper end of the first semiconductor layer 310'. The second semiconductor layer 320' may include a main body having a ring shape and an upper end, the sides of which are inclined. That is, the second semiconductor layer 320' may be in direct contact with the parallel sides of the active layer 330' and the inclined upper end of the first semiconductor layer 310'. However, the second semiconductor layer 320' is not formed on the lower end of the first semiconductor layer 310'.

An electrode layer 370' is disposed to surround an outer surface of the second semiconductor layer 320'. That is, a shape of the electrode layer 370' may be substantially the same as that of the second semiconductor layer 320'. That is, the electrode layer 370' may be in contact with the entire outer surface of the second semiconductor layer 320'.

An insulating film 380' may be disposed to surround the outer sides of the electrode layer 370' and the first semiconductor layer 310'. The insulating film 380' may be in direct contact with the lower end of the first semiconductor layer 310' and exposed lower ends of the active layer 330' and the second semiconductor layer 320', including the electrode layer 370'.

In concluding the detailed description, those skilled in the art will appreciate that many variations and modifications can be made to the preferred embodiments without substantially departing from the principles of the invention. Therefore, the disclosed preferred embodiments of the invention are used in a generic and descriptive sense only and not for purposes of limitation.

The invention claimed is:

1. A display device comprising:
   a substrate;
   a first electrode and a second electrode disposed on the substrate to be spaced apart from each other;
   a first insulating layer disposed on the substrate to cover at least a portion of the first electrode and a portion of the second electrode; and
   at least one first light-emitting element disposed on the first insulating layer and between the first electrode and the second electrode,
   wherein the first insulating layer comprises:

a first sub-insulating layer including a first portion containing a hydrophilic material and a second portion which is a region of the first insulating layer except for the first portion and which contains a hydrophobic material; and a second sub-insulating layer disposed below the first sub-insulating layer, and wherein at least a portion of the at least one first light-emitting element is disposed on the first portion.

2. The display device of claim 1, wherein the first portion is located between the first electrode and the second electrode.

3. The display device of claim 2, wherein an angle of contact between the first portion and water is 5 degrees or less, and an angle of contact between the second portion and water is 100 degrees or more.

4. The display device of claim 1, wherein the first insulating layer comprises silicon oxycarbide,
the first portion has a higher concentration of oxygen atoms than the second portion, and
the second portion has a higher concentration of fluorine atoms than the first portion.

5. The display device of claim 2, wherein the first portion is disposed to partially overlap a first side of the first electrode and a second side of the second electrode facing the first side of the first electrode.

6. The display device of claim 5, wherein the second portion overlaps a second side of the first electrode which does not face the second side of the second electrode, and a first side of the second electrode which does not face the first side of the first electrode.

7. The display device of claim 1, wherein a first region in which the first portion is located and a second region in which the second portion is located are defined, wherein the second region surrounds the first region.

8. The display device of claim 7, wherein the at least one first light-emitting element in the first region has a higher density than the at least one first light-emitting element in the second region.

9. The display device of claim 8, wherein an emission area, to which light from the at least one first light-emitting element is emitted, is defined, and
the emission area comprises the first region.

10. The display device of claim 1, further comprising a third electrode and a fourth electrode disposed on the substrate and spaced apart from each other,
wherein the first insulating layer is also disposed on the third electrode and the fourth electrode,
the first portion is also located between the third electrode and the fourth electrode, and
the second portion is located between the third electrode and the first electrode.

11. The display device of claim 10, further comprising at least one second light-emitting element disposed on the first portion and between the third electrode and the fourth electrode,
wherein the at least one second light-emitting element emits light having a different wavelength band from a wavelength band of the first-light emitting element.

12. A display device comprising:
a substrate;
a first electrode disposed on the substrate and extending in a first direction;
a second electrode extending in the first direction and spaced apart from the first electrode in a second direction different from the first direction;

a first insulating layer disposed to cover at least a portion of the first electrode and at least a portion of the second electrode; and at least one light-emitting element disposed on the first insulating layer and between the first electrode and the second electrode, wherein the first insulating layer comprises:
a first portion including a hydrophilic material and located in a region between the first electrode and the second electrode; and
a second portion which includes a hydrophobic material and is a region of the first insulating layer except for the first portion.

13. The display device of claim 12, further comprising a third electrode spaced apart from the first electrode in the second direction,
wherein the first insulating layer extends to be disposed on the third electrode, the second portion is located between the first electrode and the third electrode, and
the light-emitting elements between the first electrode and the second electrode has a higher density than a density of the light-emitting elements between the first electrode and the third electrode.

14. The display device of claim 13, wherein an angle of contact between the first portion and water is 5 degrees or less, and an angle of contact between the second portion and water is 100 degrees or more.

15. The display device of claim 14, wherein the first insulating layer further comprises a sub-insulating layer located below the first portion and the second portion.

16. The display device of claim 15, wherein the first portion is provided in plural,
at least two first portions of the plurality of first portions are spaced apart from each other in the second direction, and
the second portion is located in a region between the at least two first portions.

17. A manufacturing method of a display device, comprising:
forming a substrate, a first electrode and a second electrode disposed on the substrate to be spaced apart from each other, and a first insulating layer covering at least a portion of the first electrode and the second electrode;
forming, on the first insulating layer, a first portion including a hydrophilic material and a second portion including a hydrophobic material; and
disposing a light-emitting element on the first portion and between the first electrode and the second electrode.

18. The manufacturing method of claim 17, wherein the forming of the first portion and the second portion comprises:
forming the second portion by emitting a first plasma to the first insulating layer; and
forming the first portion by emitting a second plasma to the first portion between the first electrode and the second electrode.

19. The manufacturing method of claim 18, wherein the first insulating layer comprises silicon oxycarbide, the first plasma comprises a fluorine (F)-based plasma, and the second plasma comprises an oxygen (O)-based plasma.

20. The manufacturing method of claim 19, wherein the first insulating layer further comprises a sub-insulating layer located below the first portion and the second portion.

* * * * *